(12) United States Patent
Mills et al.

(10) Patent No.: US 6,976,111 B1
(45) Date of Patent: Dec. 13, 2005

(54) HIGH-DENSITY REMOVABLE EXPANSION MODULE HAVING I/O AND SECOND-LEVEL REMOVABLE EXPANSION MEMORY

(75) Inventors: Kevin J. Mills, Palo Alto, CA (US); Michael L. Gifford, San Leandro, CA (US)

(73) Assignee: Socket Communications, Inc., Newark, CA (US)

( * ) Notice: Subject to any disclaimer, the term of this patent is extended or adjusted under 35 U.S.C. 154(b) by 0 days.

(21) Appl. No.: 10/009,452

(22) PCT Filed: May 9, 2000

(86) PCT No.: PCT/US00/12796

§ 371 (c)(1), (2), (4) Date: Jun. 10, 2002

(87) PCT Pub. No.: WO00/68770

PCT Pub. Date: Nov. 16, 2000

Related U.S. Application Data

(63) Continuation-in-part of application No. 09/439,966, filed on Nov. 12, 1999, now Pat. No. 6,599,147, which is a continuation-in-part of application No. 09/309,373, filed on May 11, 1999, now Pat. No. 6,353,870.

(51) Int. Cl.[7] .......................... G06F 13/00; G06F 1/16; H01R 33/00
(52) U.S. Cl. .......................... 710/301; 710/2; 711/115; 439/76.1; 439/377; 439/946
(58) Field of Search .......................... 710/301, 1–2, 710/300–304, 100, 6, 72; 361/679–686; 711/115; 439/76.1, 377, 946; 455/403, 556.2; 370/908; 709/227

(56) References Cited

U.S. PATENT DOCUMENTS

| 4,744,006 A | 5/1988 | Duffield |
| 5,049,728 A | 9/1991 | Rovin |
| 5,184,282 A | 2/1993 | Kaneda et al. |
| 5,291,584 A | 3/1994 | Challa et al. |
| 5,320,552 A | 6/1994 | Reichardt et al. |
| 5,491,774 A | 2/1996 | Norris et al. |
| 5,519,577 A | 5/1996 | Dudas et al. |
| 5,545,057 A | 8/1996 | Tan et al. |

(Continued)

OTHER PUBLICATIONS

"A virtual interface bus for portable PCs" by Burris, D.; Cargile, F.M.; Dalton, A. (abstract only) Publication Date: Aug. 30-Sep. 2, 1999.*

(Continued)

Primary Examiner—Gopal C. Ray
(74) Attorney, Agent, or Firm—Townsend and Townsend and Crew LLP

(57) ABSTRACT

The utility of portable computer hosts, such as PDAs (or handhelds), is enhanced by methods and apparatus for removable expansion modules (100) having application specific circuitry, a second-level-removable memory (120), and optional I/O (140), in a number of illustrative embodiments. In addition to providing greater expansion utility in a compact and low profile industrial design, the present invention permits memory configuration versatility for application specific expansion modules, permitting easy user field selection and upgrades of the memory used in conjunction with the expansion module. Finally, from a system perspective, the present invention enables increased parallelism and functionality previously not available to portable computer devices.

55 Claims, 24 Drawing Sheets

U.S. PATENT DOCUMENTS

| | | |
|---|---|---|
| 5,550,709 A | 8/1996 | Iwasaki |
| 5,563,400 A | 10/1996 | Le Roux |
| 5,566,290 A | 10/1996 | Silverbrook |
| 5,579,430 A | 11/1996 | Grill et al. |
| 5,594,873 A * | 1/1997 | Garrett ................... 710/300 |
| 5,611,055 A | 3/1997 | Krishan et al. |
| 5,611,057 A | 3/1997 | Pecone et al. |
| 5,615,344 A | 3/1997 | Corder |
| 5,619,396 A | 4/1997 | Gee et al. |
| 5,661,635 A | 8/1997 | Huffman et al. |
| 5,663,901 A | 9/1997 | Wallace et al. |
| 5,671,374 A | 9/1997 | Postman et al. |
| 5,675,734 A | 10/1997 | Hair |
| 5,679,007 A | 10/1997 | Potdevin et al. |
| 5,752,857 A | 5/1998 | Knights |
| 5,818,030 A | 10/1998 | Reyes |
| 5,839,108 A | 11/1998 | Daberko et al. |
| 5,876,218 A | 3/1999 | Liebenow et al. |
| 5,887,145 A | 3/1999 | Harari et al. |
| 5,892,213 A | 4/1999 | Ito et al. |
| 5,906,516 A | 5/1999 | Sato et al. |
| 5,928,347 A | 7/1999 | Jones |
| 5,933,328 A | 8/1999 | Wallace et al. |
| 5,971,280 A | 10/1999 | Hoolhorst |
| 5,986,891 A | 11/1999 | Sugimoto |
| 6,002,605 A | 12/1999 | Iwasaki et al. |
| 6,053,748 A | 4/2000 | Bricaud et al. |
| 6,085,412 A | 7/2000 | Iwasaki |
| 6,091,137 A | 7/2000 | Fukuda |
| 6,097,605 A | 8/2000 | Klatt et al. |
| 6,102,714 A | 8/2000 | Oliphant et al. |
| 6,222,726 B1 | 4/2001 | Cha |
| 6,276,943 B1 | 8/2001 | Boutros et al. |
| 6,293,464 B1 | 9/2001 | Smalley, Jr. |
| 6,353,870 B1 | 3/2002 | Mills et al. |
| 6,599,147 B1 * | 7/2003 | Mills et al. ................. 439/377 |
| 6,691,196 B2 * | 2/2004 | Mills et al. ................. 710/301 |
| 6,863,557 B2 * | 3/2005 | Mills et al. ................. 439/377 |

OTHER PUBLICATIONS

Apr. 30, 2001 PCT written Opinion for related International application No. PCT/US00/12796, filed May 9, 2000. *MultiMediaCard System Summary Version* 2.0, MMCA, Jan. 1999.

Wes Brewer, *Smart Solutions for Smart Phones*, SanDisk Corporation, 1998.

*CompactFlash Specification Revision 1.3*, CompactFlash Association, 1998.

PC Cards and CompactFlash Size CF+ Cards for Ethernet, Serial Communications, Bar Code Scanning and Data Collection, Socket Communications, Inc., 1998.

SanDisk CompactFlash, SanDisk Corporation, Apr. 1998.

SanDisk MultiMediaCard, SanDisk Corporation, Nov. 1997.

* cited by examiner

Legend

| Pin No. | Name | Type | Description |
|---|---|---|---|
| 1 | RSV | NC | Reserved for future use |
| 2 | CMD | I/O/PP/OD | Command/Response |
| 3 | $V_{SS1}$ | S | Supply voltage ground |
| 4 | $V_{DD}$ | S | Supply voltage |
| 5 | CLK | I | Clock |
| 6 | $V_{SS2}$ | S | Supply voltage ground |
| 7 | DAT | I/O/PP | Data |

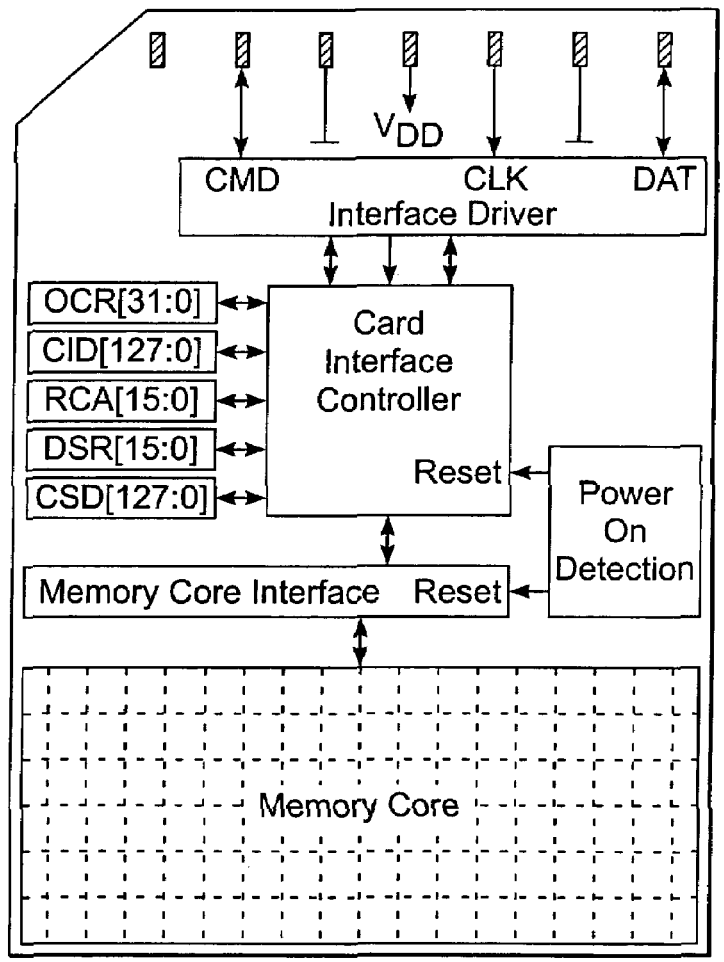

Legend

| Name | Width | Description |
|---|---|---|
| CID | 128 | Card identification number, card individual number for identification. Mandatory. |
| RCA | 16 | Relative card address, local system address of a card, dynamically assigned by the host during initialization. Mandatory. |
| DSR | 16 | Driver stage register to configure the card's output drivers. Optional. |
| CSD | 128 | Card specific data, information about the card operation conditions. Mandatory. |
| OCR | 32 | Operation condition register for cards which do not support the full voltage range. Used by a special broadcast command to detect restricted cards. Optional. |

FIG. 2 (PRIOR ART)

HIGH-DENSITY REMOVABLE EXPANSION MODULE HAVING I/O AND SECOND-LEVEL REMOVABLE EXPANSION MEMORY

CROSS-REFERENCE TO RELATED APPLICATIONS

This application is a 35 U.S.C. §371 national phase filing of International Application No. PCT/US00/12796, filed May 9, 2000, which is a Continuation-in-Part of application Ser. No. 09/439,966, filed Nov. 12, 1999, now U.S. Pat. No. 6,599,147, issued Jul. 29, 2003, which application is a Continuation-in-Part of application Ser. No. 09/309,373, filed May 11, 1999, now U.S. Pat. No. 6,353,870, issued Mar. 5, 2002.

BACKGROUND OF THE INVENTION

The invention is related to removable expansion modules or modules for computer hosts, such modules having particular application to portable computing hosts such as handheld computing devices.

The broad use of portable host computers, including laptops, notebooks, palmtops, Personal Digital Assistants (PDAs), and handheld computers (handhelds), has been severely hampered by limited capabilities for expansion or customization. Expansion and application customization has been performed via only one, or at most two, slots for removable expansion modules for I/O, I/O adapters, memories, and memory adapters. Memory expansion modules have included DRAM, SRAM, ROM, and Flash technologies. I/O expansion modules have included dedicated peripherals, networking, modems, wireless communications, serial I/O, and bar-code and other scanners.

Having only one slot meant choosing between memory or peripheral expansion. In two-slot implementations, one of the slots is generally used for peripheral expansion, and the other for memory expansion. As market forces and consumer demand are pushing future PDAs to be ever smaller, allocating packaging volume for two-slots will be increasingly viewed as a costly and nonviable solution.

If not further qualified, a general reference in this specification and the attached claims to the terms "expansion module" or "expansion module," and possibly prefaced by "removable," should be construed as a general reference to a class of generally enclosed compact expansion devices that provide fast, reliable, and robust repeated field insertion, removal, handling, and storage, ideally suited for closed-case, user-serviceable, plug-in expansion of portable and handheld computing devices. If not further qualified, a general reference in this specification and the attached claims to the term "slot," should be construed as a reference to the physical and electrical means by which a portable computing device receives a removable expansion module of the class just defined. A reference in this specification and the attached claims to the terms "closed-case," or "sealed-case," serves to indicate that insertion and removal of an expansion device does not involve significant reconfiguration or removal of the external casing of the computing device. Closed-case is not meant to foreclose the possible user removal of a protective access panel or the user opening of a hinged access door. Nor is it meant to foreclose that the casing may need to be removed for more significant events best performed by a qualified service person.

Memory and Expansion Module Standards

Two of the most popular industry standards for the slots and removable modules are the PC Module and the CompactFlash Module. The PC Module has a 16-bit variant, previously known as a PCMCIA module, and a newer 32-bit variant, also known as a Module-Bus module. PC Modules include Type I, Type II, and Type III devices. If not further qualified, a general reference to PC Modules in this specification and the attached claims should be construed to refer to any of the Module-Bus (32-bit), PCMCIA (16-bit), Type I, Type II, or Type III PC Module variants.

U.S. Pat. No. 5,815,426 ('426), ADAPTER FOR INTERFACING AN INSERTABLE/REMOVABLE DIGITAL MEMORY APPARATUS TO A HOST DATA PART, assigned to Nexcom Technology, and hereby incorporated by reference, describes these and other removable expansion module and memory types suitable for PDAs. In addition to the PC Module and CompactFlash Module formats, the '426 patent includes discussions of and references to Miniature Modules, Solid State Floppy Disk Modules (SSFDCs), MultiMediaModules (MMC), Integrated Circuit (IC) Modules (also known as Smart Modules), and Subscriber Identification Module (SIM) Modules.

CompactFlash Standards

The physical, electrical, and software interface architecture of CompactFlash Modules (CF+ Modules and CF Modules) is taught in the CompactFlash Specification Revision 1.3, Copyright 1998, and the CF+ and CompactFlash Specification Revision 1.4, Copyright 1999, both by the CompactFlash Association (CFA), P.O. Box 51537, Palo Alto, Calif. 94303, and both of which are hereby incorporated by reference. Parts of FIGS. 5 and 6 are reproduced or derived from the CompactFlash Specification Revision 1.3 document. Strictly speaking, CompactFlash nomenclature uses CF to denote modules that are primarily limited to flash data storage, and uses CF+ to denote modules that may have any or all off flash data storage, I/O devices, and magnetic disk data storage. CF and CF+ modules presently include Type I (3.3 mm thick) and Type II (5 mm thick) devices. Both Type I and Type II CF modules are 36.4 mm long by 42.8 mm wide, or roughly "matchbook-sized." A Type III device is being defined as discussed in a later section herein. If not further qualified, a general reference to CompactFlash (or CF) in this specification and the attached claims should be construed to refer to any of the CF, CF+, Type I, Type II, or Type III CompactFlash variants.

U.S. Pat. No. 5,887,145 ('145), REMOVABLE MOTHER/DAUGHTER PERIPHERAL MODULE, assigned to SanDisk Corporation, and hereby incorporated by reference, describes the required features of host systems for CompactFlash Modules, including controllers required by CompactFlash memory modules (CF modules) and comprehensive controllers required by CompactFlash memory and I/O modules (CF+ modules).

MultiMediaModule

FIG. 1 represents a prior art MultiMediaModule (MMC) form factor and its pad definitions. The MMC is 1.4 mm thick, 24 mm wide, and 32 mm long. FIG. 2 represents the prior art internal architecture of a generic MultiMediaModule and its registers. FIG. 3 illustrates the prior art functional partitioning of a generic MultiMediaModule system. FIG. 4 illustrates the prior art physical partitioning of a generic MultiMediaModule system.

The MMC and MMC related system issues are taught in the MultiMediaModule System Summary Version 2.0, Copyright January 1999, by the MultiMediaModule Association, 19672 Stevens Creek Blvd., #404, Cupertino, Calif. 95014-2465, which is hereby incorporated by reference.

FIGS. 1, 2, 3, 4, and part of 6 are reproduced or derived from the MultiMediaModule System Summary document. In FIG. 1, the Type column of the legend is used to categorize the pin type as one of: Supply (S), Input (I), Output (O), Push-Pull (PP), Open-Drain (OD), and Not Connected (NC). The DAT (data) pin is output only (O) for read-only modules.

FIGS. 5 and 6 are different views comparing the form factors of the prior art CompactFlash Module (top) and MultiMediaModule (bottom). In FIGS. 5 and 6, the CompactFlash Module and the MultiMediaModule are both roughly to equal scale.

Secure Digital Memory Module and Symmetric Secure Digital Module

The Secure Digital Memory Module (SD Memory Module, or SD) is an extension of the MMC standard. The SD standard adds cryptographic security (enabling among other things, the protection of copyrighted data), up to a 4× improvement in peak data transfer rate (by redefining the existing reserved pin as a data pin and defining two additional data pins), a mechanical write-protect switch, and improved ESD tolerance. Physically, the SD asymmetrically modifies the 1.4 mm by 24 mm wide MMC form factor by augmenting the bottom (contact) side with a 0.7 mm thick and 22.5 mm wide "belly," for an overall module thickness of 2.1 mm. The SD has the same 32 mm length as the MMC.

The Symmetric Secure Digital Module (SSD Module, or SSD) is an emerging extension of the SD standard, returning to a symmetric form factor by physically augmenting the top (non-contact) side with a complementary 0.7 mm thick and 22.5 mm wide section, for an overall module thickness of 2.8 mm, and generally extending the length to 38 mm. SSD Modules feature I/O expansion capability in addition to secure memory and the 38 mm length provides additional room for antennas and enables clearance for cable mounts. The I/O expansion on an SSD may thus include wireless functionality and plugged or corded wired-I/O functionality. Wireless I/O may include IR, optical, and RF methods. RF methods include the Bluetooth networking standard.

Adapters for Removable Memories

Adapters exist or have been prophetically disclosed for physically and electrically coupling a removable memory on a slide, or stick, to a portable host via a removable expansion module of either the PCMCIA Module or CompactFlash Module form factors. The previously mentioned '426 patent describes such removable memory adapters. The focus of these existing memory adapters has been limited to merely providing an interface adapter, or bridge, between a first interface type (the host to removable-expansion-module interface) and a second interface type (the removable memory stick).

PC Module Mother and CompactFlash Module Daughter Combinations

Adapters exist or have been prophetically disclosed that comprise a special mother PC Module designed to accept one or more daughter CompactFlash Modules of one or more types. The previously '145 patent describes such CompactFlash adapters. The focus of these existing mother/daughter combinations has also been limited. First, the daughters have been used for memory expansion for the host platform, primarily in the form of flash-memory-based mass-storage-like devices. In this first approach, the mother module provides the requisite mass-storage controller functionality. Second, the daughters have been used for dedicated peripheral, I/O, or communication functions. In this second approach, the mother module has a so-called comprehensive controller that augments the mass-storage controller functionality with functions commonly required or useful to multiple daughter modules. Third, in a variation of either of the first two paradigms, functions of the general-purpose host may be relocated to the mother module.

Open-Back Module Expansion Standards

The previously discussed expansion module (or module) implementations have been of a first type wherein the module is mated with a closed-back mother device by (full or partial) insertion into a receiving chamber that is inside the external casing of the mother device. The chamber usually is of a standardized minimum width and insertion depth. The module insertion into the chamber is facilitated by edge-guides internal to the chamber and insertion is (usually) via a standardized minimum width×minimum height circumscribed portal (mouth, or orifice) in the mother device's external casing. The chamber portal is sometimes protected by a hinged or removable access panel or by a stub (a dummy module with an external end flanged to block off most of the portal) inserted into the chamber. According to this first type, the modules are designed to have dimensions compatible with the insertion depth×width, edge guides, and width×height orifice of the chamber.

For hand-held computer or PDA applications, a second type of expansion module also exists. The second type of expansion module makes use of a "open-back" (or open-face) industrial design approach previously applied to other hand-held devices, such as cellular telephones. In open-back hand-held devices, a standardized back-mount is made integral to the device. Families of removable components (such as batteries), varying widely size and make-up but otherwise interchangeable, are designed to be compatible to the standardized back-mount. For open-back devices, the industrial design form-factor (appearance and volume) becomes a function of both the device and the mated component.

As applied to a hand-held mother device, an open-face expansion module is mated with a companion open-back device by (full or partial) insertion into a receiving recess of (usually) standardized width×minimum depth that is integral to, but substantially on the outside of, the device. The module insertion into the recess is via (usually) standardized module-edge guides incorporated into the open recess of the device. In a manner not unlike that for modules in closed-back expansion applications, open-face modules are designed to have dimensions compatible with the width×minimum depth and edge guides of the device recess. But since the recess of an open-back device by definition has no circumscribed portal, the module height and shape are largely unrestricted. Instead the height and shape of the interchangeable modules are restricted only by bounds imposed by practical utility, bounds imposed to avoid mechanical interference with other objects in common system configurations, and bounds imposed by ergonometric concerns.

Expansion modules for the Handspring Visor handheld computer are an example of open-face expansion modules. These modules are designed in accordance with the Handspring Springboard expansion slot. The technology of the Springboard slot is publicly disclosed in a number of documents published on the Handspring Web-Site (http:\\www.handspring.com). "The Springboard Platform," is a Handspring "white-paper" that broadly summarizes the technology. "Development Kit for Handspring Handheld Computers," Release 1.0, Document No. 80-0004-00, printed in 1999, gives a detailed description targeted at developers of Springboard modules. Open-face functionality is also proposed for next generation CompactFlash Type III (CF+ Type III) devices, whose specification is presently being defined by a working group within the Compact Flash Association. More specifically, the CF+ Type III devices are expected to enable handhelds to continue to use the present 50-pin CompactFlash bus and connector but make use of an open-back industrial design philosophy.

Background for Expansion Module Based I/O Functions

Techniques are known in the art for making and using systems that perform I/O functions in an expansion module. For example, see U.S. Pat. No. 5,671,374 ('374), PCMCIA INTERFACE MODULE COUPLING INPUT DEVICES SUCH AS BARCODE SCANNING ENGINES TO PERSONAL DIGITAL ASSISTANTS AND PALMTOP COMPUTERS, assigned to TPS Electronics, which is hereby incorporated by reference. The '374 patent teaches the use of PDAs and similar hosts equipped with PC module interfaces for I/O devices including portable laser-scanners, magnetic stripe and ink readers, keyboards and keypads, OCR devices, and trackballs.

Techniques are also known in the art for making and using PC Module-based radios for applications based in a portable host. For example, see U.S. Pat. No. 5,519,577 ('577), SPREAD SPECTRUM RADIO INCORPORATED IN A PCMCIA TYPE II MODULE HOLDER, assigned to Symbol Technologies, and hereby incorporated by reference.

Techniques are also known in the art for making and using disk emulation devices based on flash memory. For example, see U.S. Pat. No. 5,291,584 ('584), METHODS AND APPARATUS FOR HARD DISK EMULATION, assigned to Nexcom Technology, and hereby incorporated by reference.

Background for Relevant Application Specific Functions

Techniques are known in the art for making and using systems that download or capture compressed digital audio for storage and later playback using dedicated removable media. For example, U.S. Pat. No. 5,676,734 ('734), SYSTEM FOR TRANSMITTING DESIRED DIGITAL VIDEO OR AUDIO SIGNALS, assigned to Parsec Sight/Sound, and hereby incorporated by reference, teaches a system for transmitting digital video or audio signals over a telecommunications link from a first to a second party. In addition, U.S. Pat. No. 5,579,430 ('430), DIGITAL ENCODING PROCESS, assigned to Fraunhofer Gesellschaft zur Foerderung der angewandten Forschung e.V., and hereby incorporated by reference, teaches processes for encoding digitized analog signals. Such processes are useful for insuring high-quality reproduction while reducing transmission bandwidth and data storage requirements.

Techniques are also known in the art for making and using record and playback portable host devices based on a dedicated flash memory. For example, see U.S. Pat. No. 5,491,774 ('774), HANDHELD RECORD AND PLAYBACK DEVICE WITH FLASH MEMORY, assigned to Comp General Corporation, and hereby incorporated by reference, and U.S. Pat. No. 5,839,108 ('108), FLASH MEMORY FILE SYSTEM IN A HANDHELD RECORD AND PLAYBACK DEVICE, assigned to Norris Communications, also hereby incorporated by reference.

SUMMARY OF THE INVENTION

The utility of computer hosts, including portable computer hosts, such as PDAs (or handhelds), is enhanced by methods and apparatus for removable expansion modules (cards) having application specific circuitry, a second-level-removable memory, and optional I/O, in a number of illustrative embodiments. The term "second-level" is intended to emphasize that while the expansion module is removable from a computer host at a first-level of functionality, the expansion memory is independently removable from the expansion module, providing a second-level of functionality. In addition to providing greater expansion utility in a compact and low profile industrial design, the present invention permits memory configuration versatility for application specific expansion modules, permitting easy user field selection and upgrades of the memory used in conjunction with the expansion module. Finally, from a system perspective, the present invention enables increased parallelism and functionality previously not available to portable computer devices.

In one illustrative embodiment the removable memory is in combination with an external-I/O connector or permanently attached external-I/O device, providing both I/O and memory functions in a single closed-case removable expansion module. This increases the expansion functional density for portable computer hosts, such as PDAs. That is, it increases the amount of functionality that can be accommodated within a given volume allocation for expansion devices. It also provides a viable alternative to 2-slot implementations.

In another illustrative embodiment the removable memory is a private memory for application specific circuitry within the closed-case-removable expansion module. This enhances the utility of portable computer hosts, such as PDAs, as universal chassises for application specific uses.

Some of the illustrative embodiments make use of a Type II CompactFlash form factor, another uses a Type I form factor, but as discussed below, the invention is not limited to these particular form factors or to the CompactFlash expansion bus. As will be seen, the physical and electrical interface of the chosen expansion bus couples the expansion modules to the host, which may provides user interface functions for application specific modules.

The first-level modules according to some illustrative embodiments of the present invention include an end located slot and an internal connector for accepting a MultiMedia-Module (MMC), Secure Digital (SD) Module, or Symmetric Secure Digital (SSD) Module, as a private removable second-level module.

Another embodiment instead uses a first-level module with a top-cavity to accept a second-level module flush with the top of the first-level module, capturing the second-level module in place when the first-level module is inserted into a PDA.

In addition, the application specific module will generally have some manner of I/O to required external devices, such as scanning devices, sensors, or transducers. Otherwise, all functionality for the application specific function is self-contained within the application specific module.

Particular application specific modules for customizing general purpose PDAs via the instant invention include a media-player module for digitized media stored on removable memory and a bar-code-scanner module having scanning data stored on removable memory.

Embodiments of the present invention that make use of second-level SSD Modules (generally having secure memory and I/O capability) enable "removable I/O in removable I/O" (or "IOIO") solutions, wherein each native expansion slot of a PDA can be simultaneously configured with two independent expansion-module-based I/O functions.

BRIEF DESCRIPTION OF THE DRAWINGS

FIG. 2 represents the prior art internal architecture of a generic MultiMediaModule and its registers;

DESCRIPTION OF SPECIFIC EMBODIMENTS

Components of the Expansion Module

Figure 7:
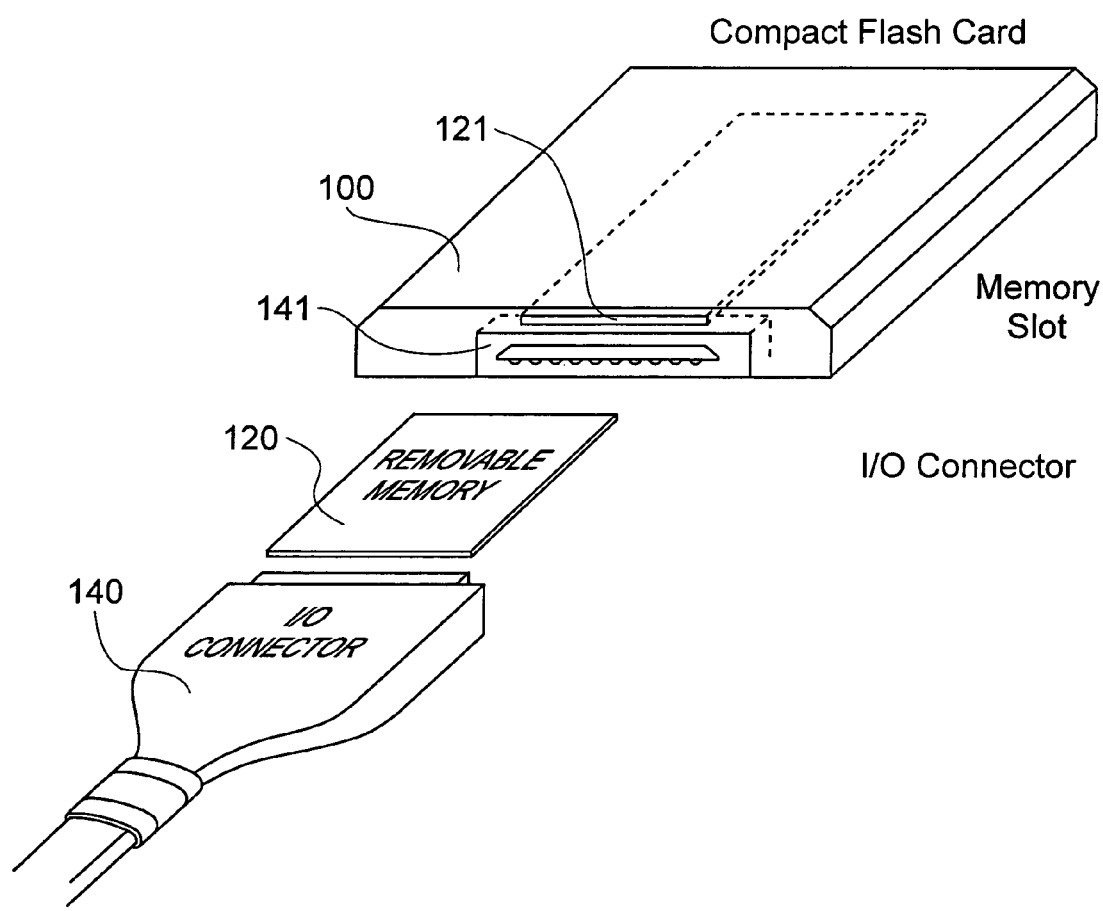
FIG. 7 is an abstract drawing representing removable expansion module embodiment separate from the PDA, and with the I/O and memory disengaged from the removable expansion module.

FIG. 7 is an abstract drawing representing a closed-case removable expansion module (card) 100, i.e., an expansion module that may be inserted into and removed out of a closed-case computer host. The module is especially suitable for use in a portable host, such as a PDA. System embodiments and applications will be discussed below. In accordance with the present invention, the expansion module of FIG. 7 includes a connector 141 for I/O interconnect and a slot 121 for a removable memory. FIG. 7 shows the I/O interconnect 140 and removable memory 120 disengaged from the removable expansion module.

Figure 8:
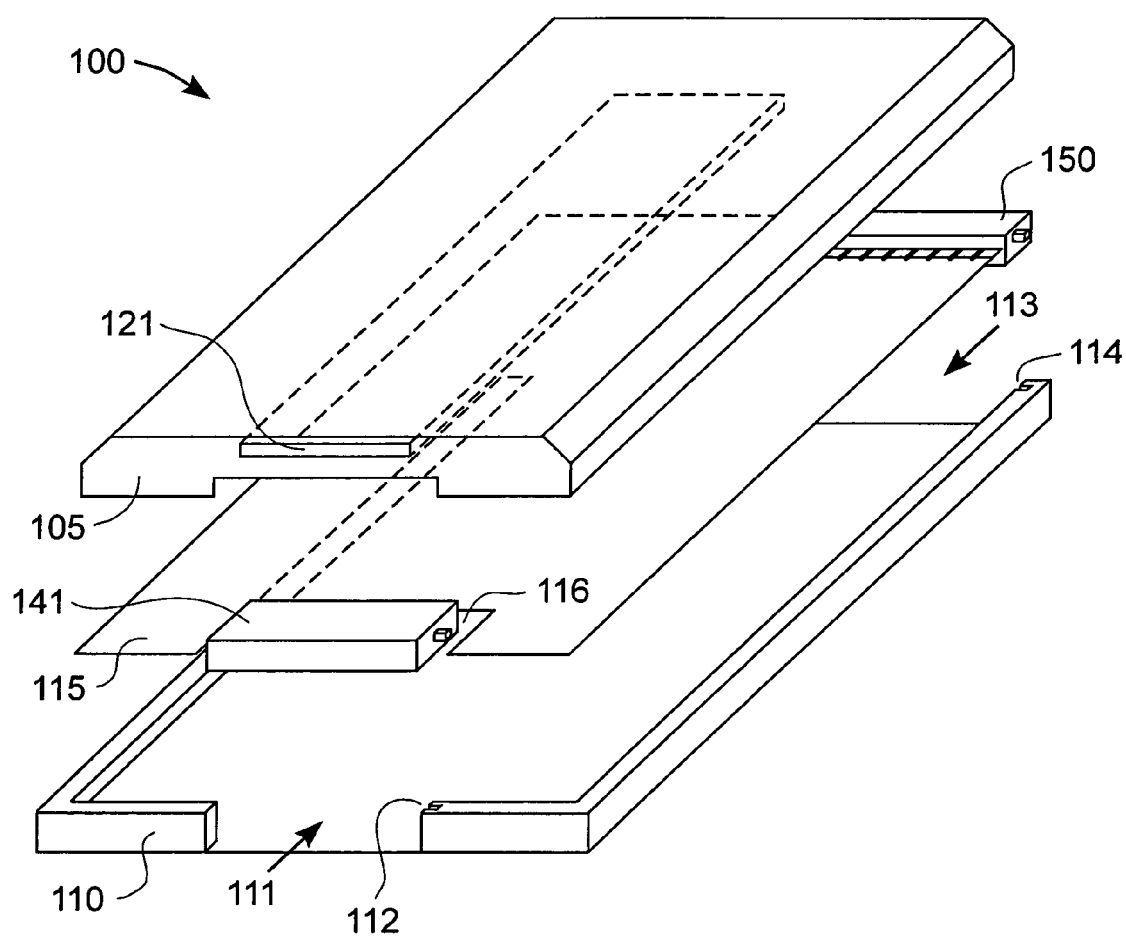
FIG. 8 is an abstract drawing representing an exploded view of the removable expansion module, including the outer frame, inner PCB, and connectors.

FIG. 8 is an abstract drawing representing an exploded view of the removable expansion module 100 of FIG. 7, including upper 105 and lower 110 frame members of the outer frame, inner printed circuit board (PCB) 115, and connectors. An opening 111 is provided in the lower frame 110 for receiving the connector 141 for I/O interconnect. A second opening 113 is provided in the lower frame 110 for receiving the connector 150 for host interconnect. Additionally, a slot 112 is provided on both sides of the opening 111 to aid in the alignment and retention of the connector 141, and a slot 114 is provided on both sides of opening 113 to aid in the alignment and retention of the connector 150. An opening 116 is provided in the PCB for receiving the connector 141.

Figure 9:
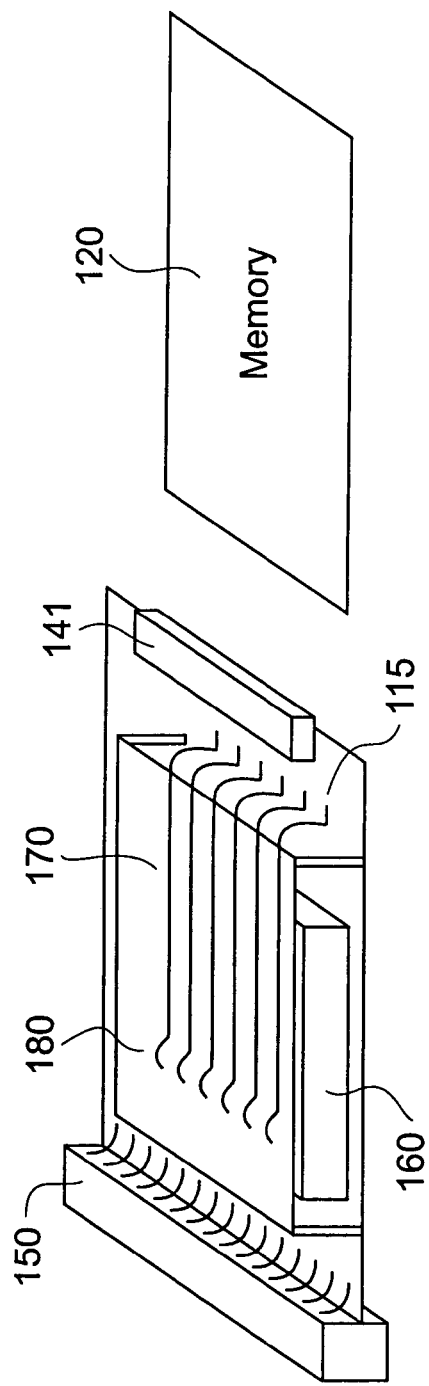
FIG. 9 is an abstract drawing representing a view of the removable expansion module, with the outer frame removed, and a removable memory roughly aligned with the contact fingers to which it mates within the removable expansion module.

FIG. 9 is an abstract drawing representing a view of the removable expansion module 100 of FIG. 7, with the outer frame members removed, and a removable memory 120 roughly aligned with the contact fingers 180 to which it mates within the removable expansion module. Circuitry 160 is provided, including I/O adapter circuitry, removable memory adapter circuitry, and application-specific circuitry. A support shelf 170 supports, aligns, separates, and isolates the underside of the contact fingers 180 from the circuitry 160.

Figure 10:
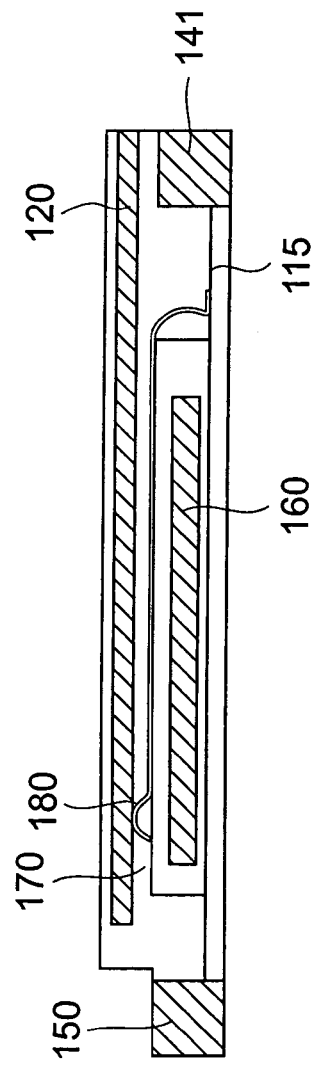
FIG. 10 is an abstract drawing representing a cut away side view of the removable expansion module, with the removable memory inserted into the removable expansion module.

FIG. 10 is an abstract drawing representing a cut away side view of the removable expansion module 100 of FIG. 7, with the removable memory 120 inserted into the removable expansion module.

In an illustrative embodiment, the expansion module 100 and associated host connector 150 are compatible with the Type II CompactFlash Module as described in the previously referenced CompactFlash Specification. The I/O connector 141 is compatible with a PC-Module industry standard Honda-style 15-pin connector. The slot 121, removable memory 120, and removable memory adapter circuitry of circuitry 160, are compatible with the MultiMediaModule as described in the previously referenced MultiMediaModule System Summary.

Details of Component Assemblies and Stages of Assembly

Figure 11:
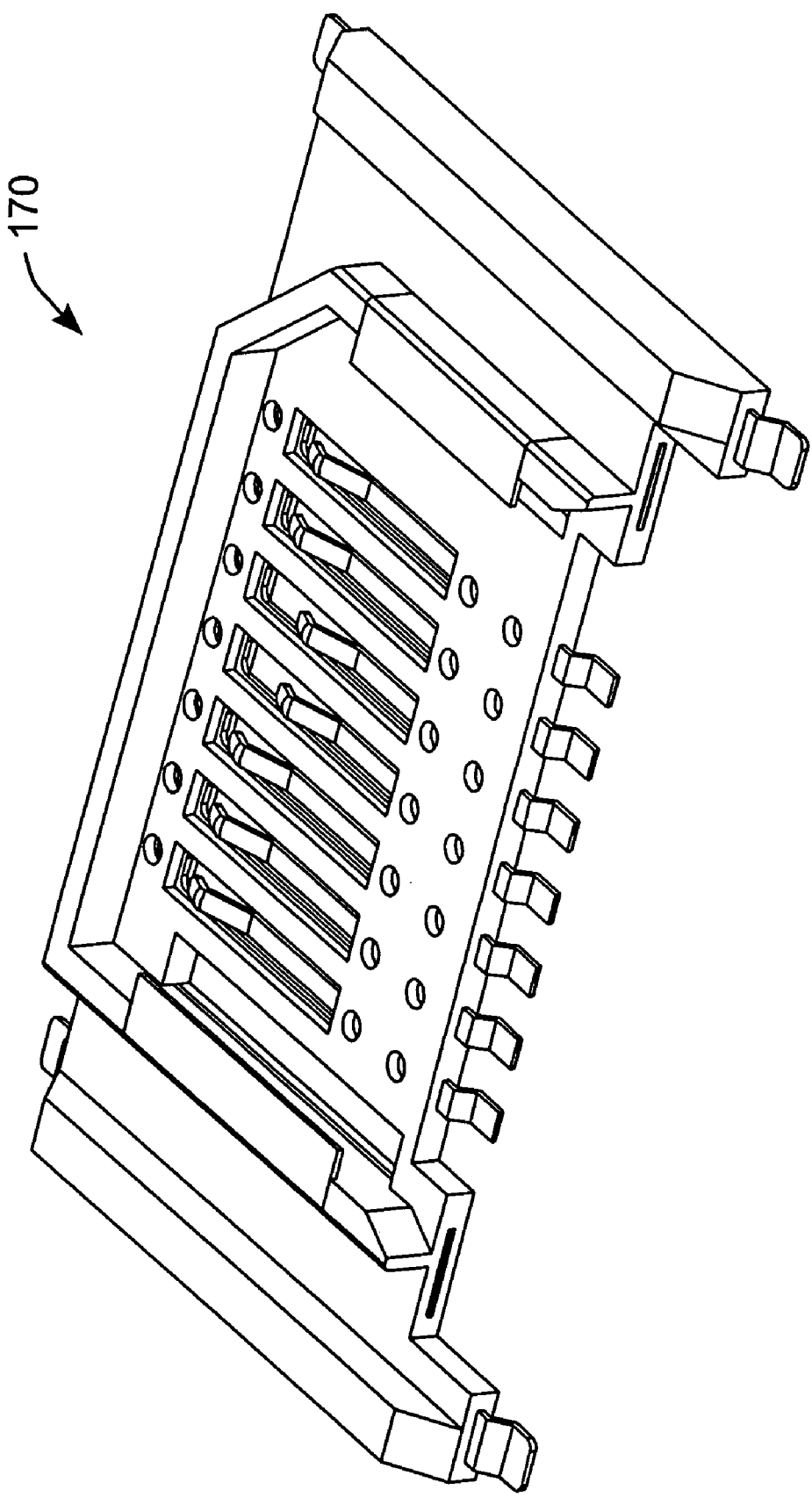
FIG. 11 is an axonometric projection of a contact finger assembly for making electrical connection with the second-level-removable expansion memory.
Figure 12:
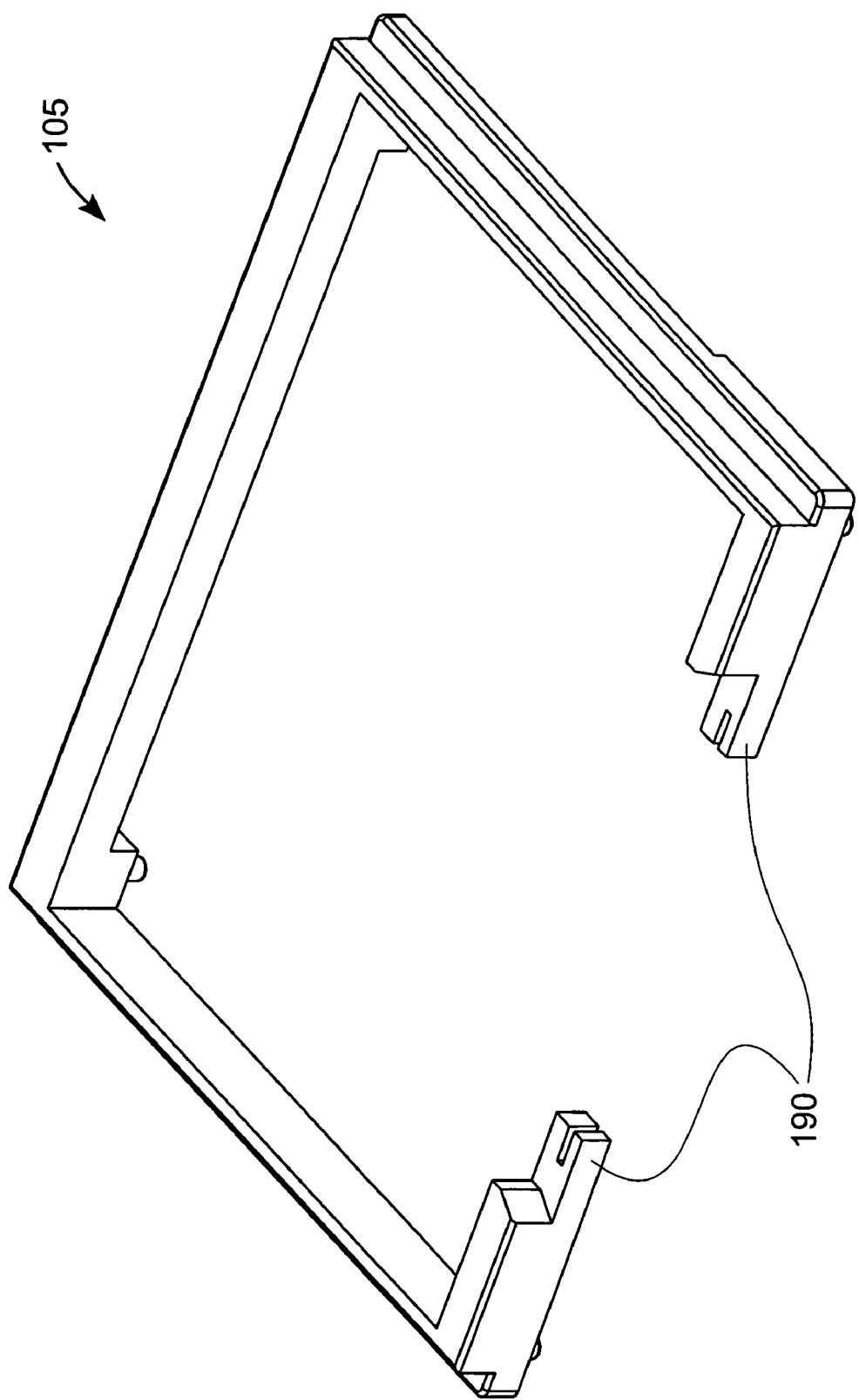
FIG. 12 is an axonometric projection of the upper section of a CF Type II frame in accordance with an illustrative embodiment.
Figure 13:
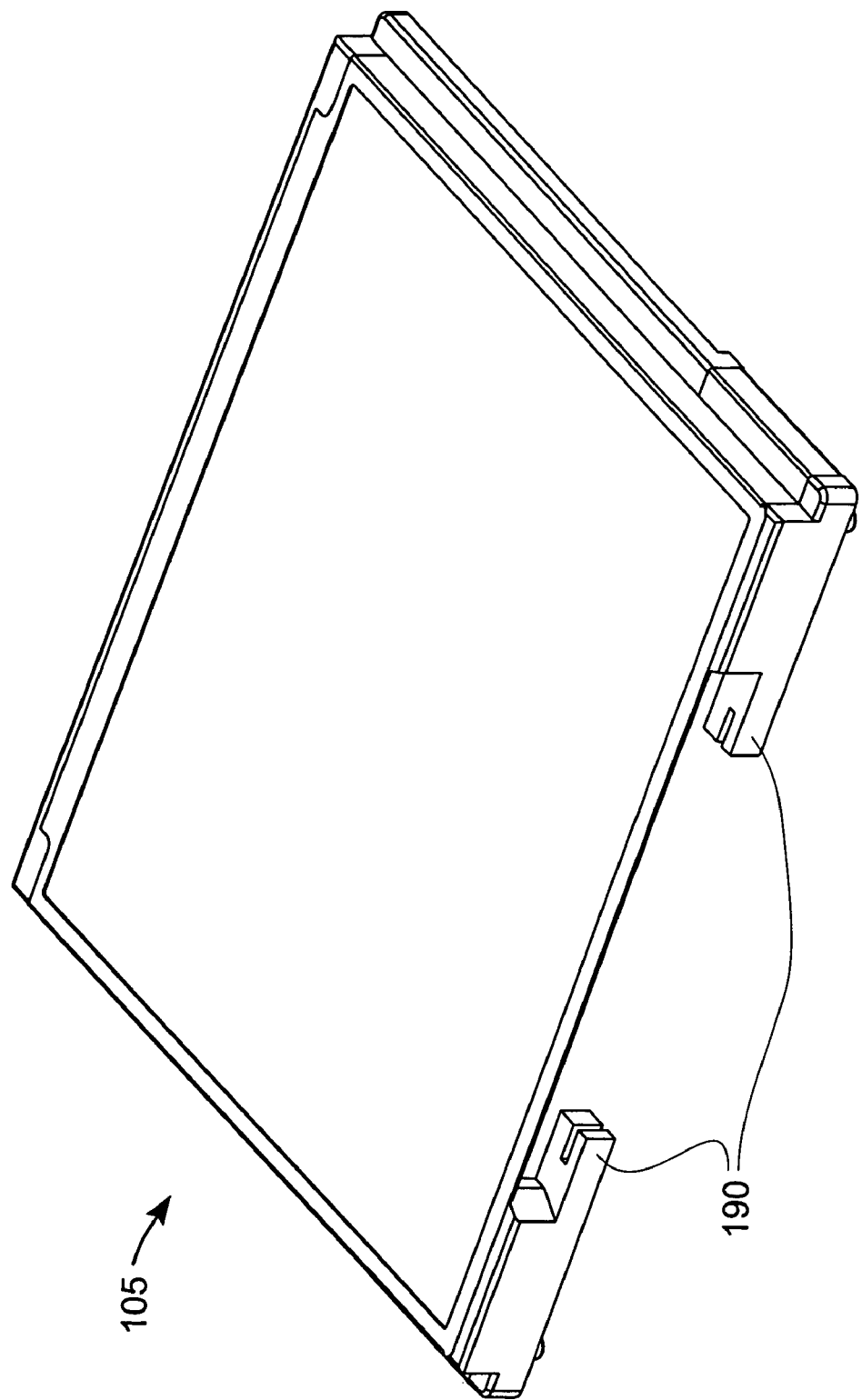
FIG. 13 is an axonometric projection of a CF Type II top case, comprising the upper section of the CF frame of FIG. 12 with a metal panel top.

FIG. 11 through FIG. 13 are axonometric projections showing the component assemblies for a CF Type II expansion module illustrative embodiment of the expansion module of FIG. 7 and in accordance with the present invention.

FIG. 11 shows a contact finger assembly for making electrical connection with the second-level-removable expansion module. In certain implementations it may be desirable for the contact fingers corresponding to the power supply (module pins 3 and 4 in the assembly of FIG. 11) to be offset from the other contact fingers. This may be done so that as the module is inserted, connection of the power supply occurs prior to connection of the other signals, and similarly, as the module is removed, disconnection of the other signals occurs prior to disconnection of the power supply. The underside of the contact finger assembly additionally has four alignment pins, two underneath the ends of each of the far side portions of the assembly. These pins and the assembly as a whole engage the PCB by way of matching alignment holes drilled in the PCB. Prior to mounting the contact finger assembly onto the PCB, a solder paste is applied to the PCB. The contact assembly and PCB will be ultimately reflow soldered, permanently attaching the contact assembly to the PCB.

The PCB acts as a chassis, supporting the expansion bus connector, the I/O connector, the contact finger assembly, and the application specific active circuitry of the expansion module. In the particular embodiment shown, due to space constraints on the topside of the PCB, the active circuitry is limited to the bottom side of the PCB. However, the use of other connectors and other contact finger assemblies will generally enable placement of active circuitry on the topside of the PCB.

FIG. 12 illustrates the upper section 105 of a CF Type II frame in accordance with an illustrative embodiment. FIG. 13 diagrams a CF Type II top case, comprising the upper section of the CF frame of FIG. 12 with a metal panel top, and in accordance with the present invention. "Hooks" 190 are formed into the upper section, specifically to act (in conjunction with the metal panel top) as a slotted guide for insertion of the expansion memory.

Figure 14:
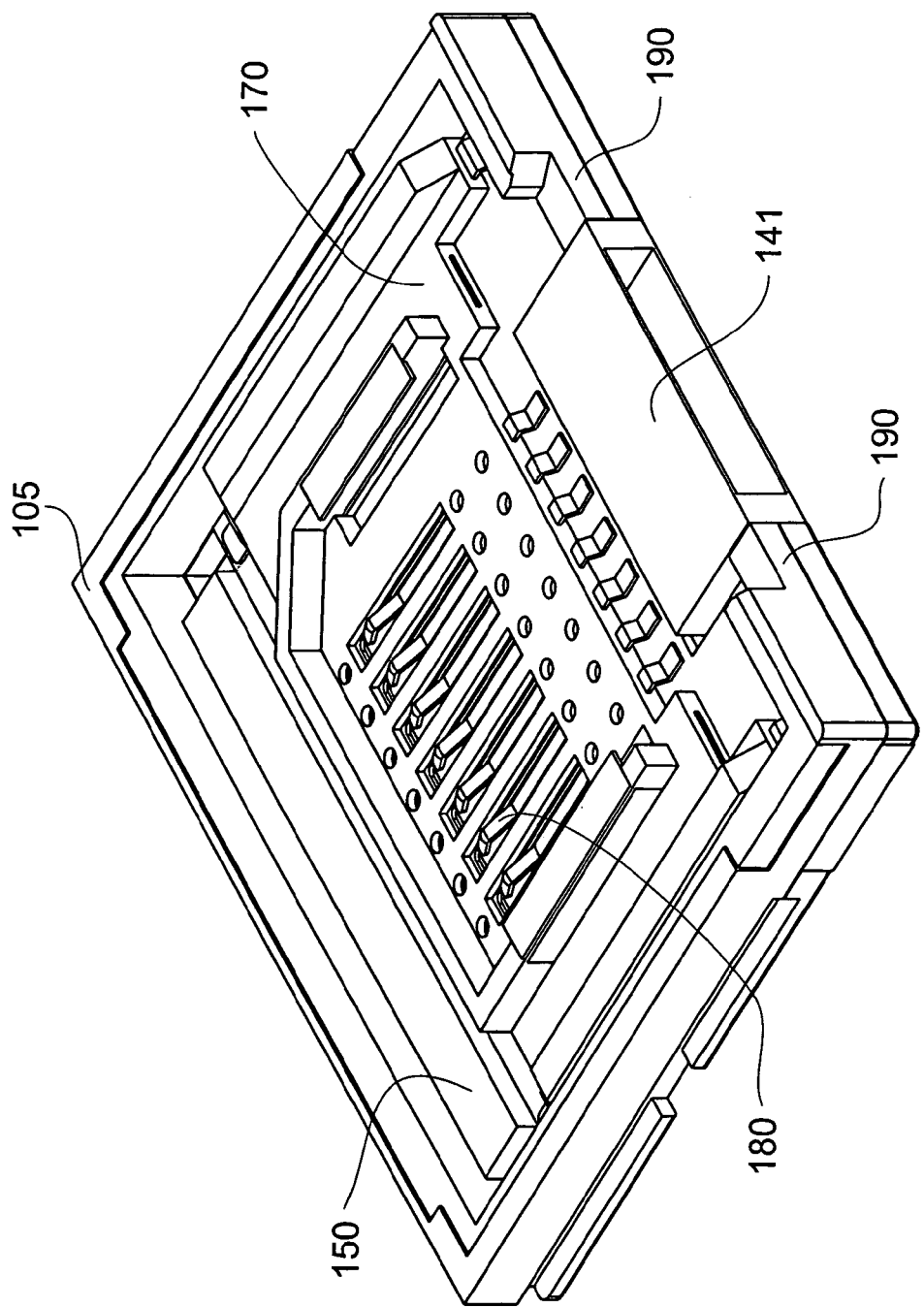
FIG. 14 is an axonometric projection of an assembly that includes a CF Type II expansion module bottom case, a Printed Circuit Board (PCB), a connector for mating with a PDA, a connector for mating with external I/O, an MMC connector mounted on the Printed Circuit Board, and a CF Type II expansion module top case without metal top.
Figure 15:
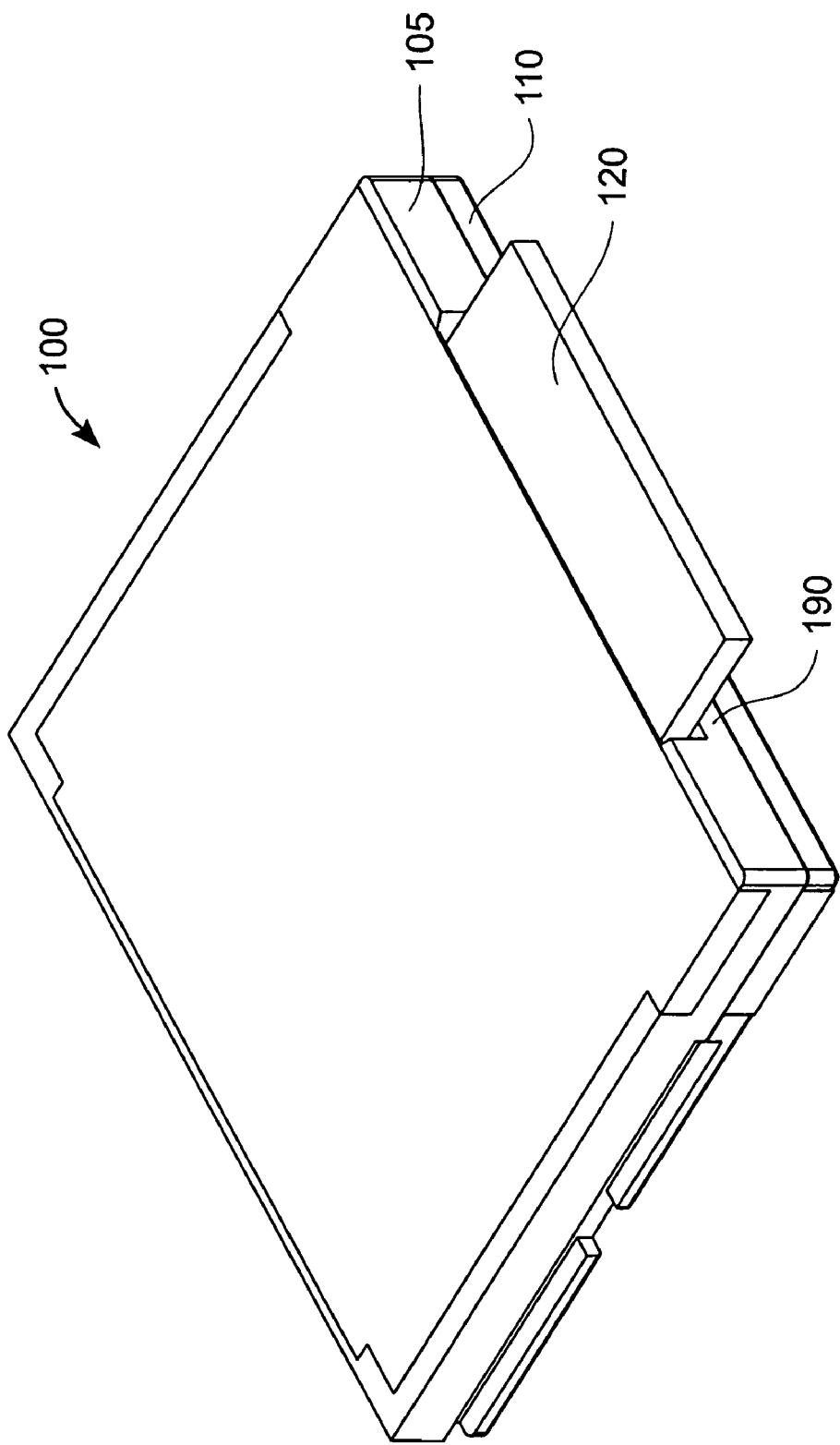
FIG. 15 is an axonometric projection of the assembly of FIG. 14 with a metal top, forming the complete CF Type II module, together with an inserted MMC.

FIGS. 14 and 15 are axonometric projections showing the CF Type II expansion module in various stages of assembly using the component assemblies of FIGS. 11 through 13. FIG. 14 includes a CF Type II expansion module bottom case, a Printed Circuit Board (PCB), a connector for mating with a PDA, a connector for mating with external I/O, an MMC connector mounted on the Printed Circuit Board, and a CF Type II expansion module top case without metal top. FIG. 15 shows the completed CF Type II module, including the metal top, together with an inserted MMC.

Top-Cavity Embodiment

Figure 16:
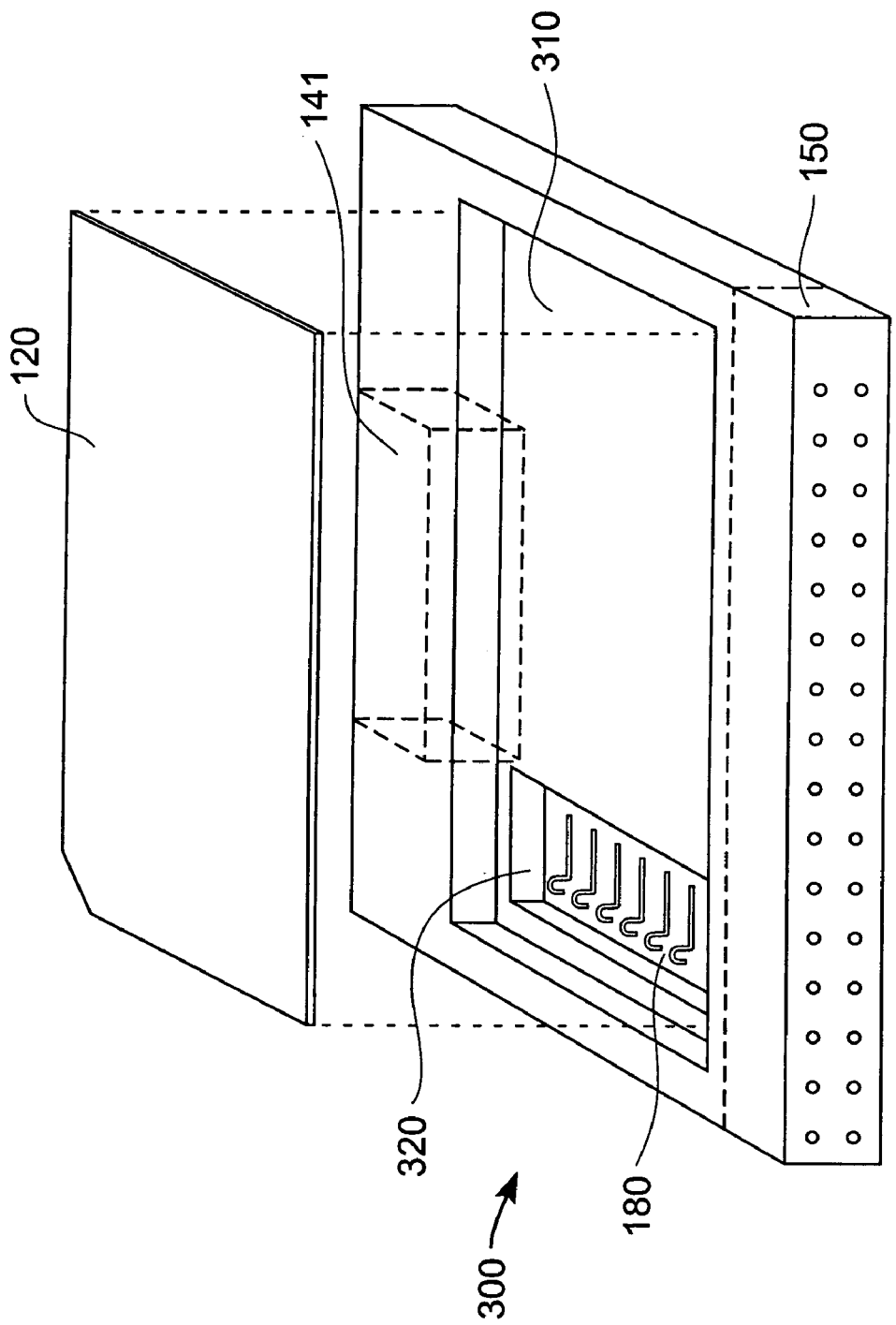
FIG. 16 shows an axonometric projection of an expansion module according to an alternate embodiment of the present invention that has an open recess for receiving an expansion memory.
Figure 17:
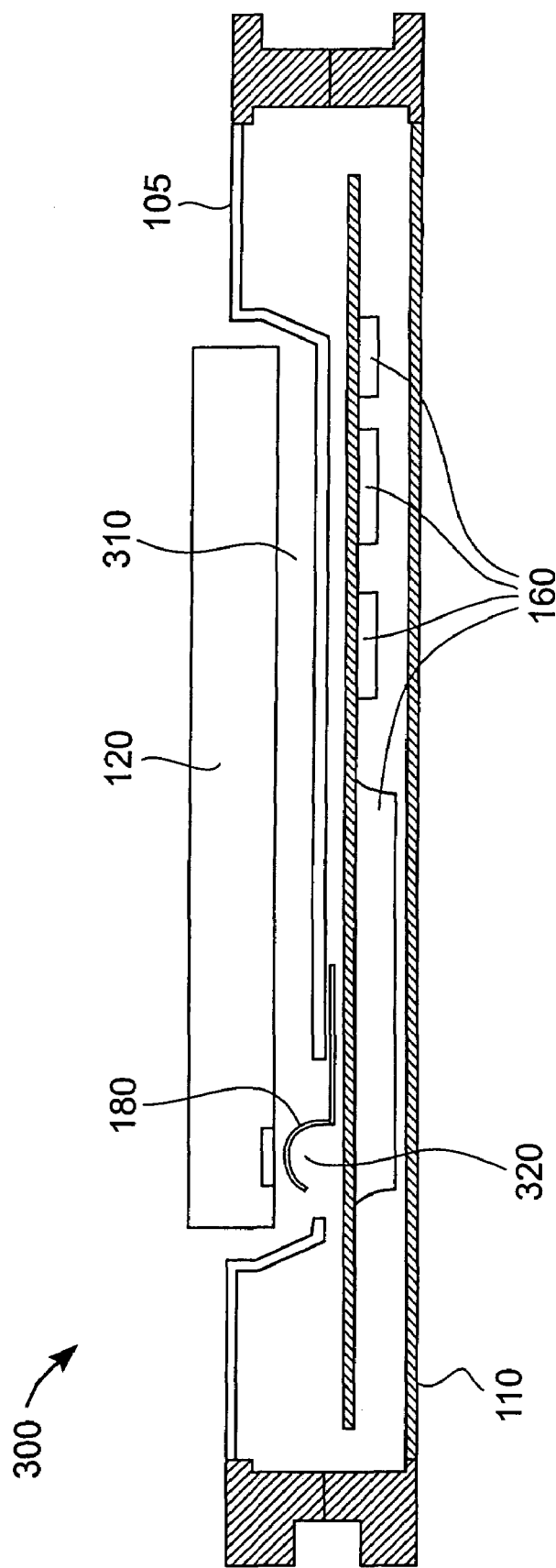
FIG. 17 is a cross section view of the expansion module of FIG. 16.

FIG. 16 shows an axonometric projection of an expansion module according to an alternative illustrative embodiment of the present invention. FIG. 17 is a cross section view of the expansion module of FIG. 16. The top case of this module has a cavity (an open recess) for receiving an expansion memory (an MMC in the illustration shown), the recess having the general shape of the expansion memory, but being slightly larger. The connector spring contacts for the memory emerge through the top of the case via one hole (a slot as shown), or a plurality of holes (slots) wherein each contact protrudes through a respective hole. In a preferred embodiment, the top-cavity expansion memory of FIG. 16 is implemented in the CF Type I form factor. The use of the CF Type I form factor for removable expansion modules having I/O and second-level removable memory is enabled by the use of the top-cavity and the general orientation shown for the expansion memory with respect to the I/O and expansion bus connectors (a 90-degree rotation compared to the non-top-cavity embodiments).

Persons skilled in the art will recognize that such top-cavity modules may be readily implemented in either the closed-back or open-back industrial design approaches by appropriately varying the rail configuration of the package frame in accordance with the desired expansion module standard.

The expansion memory is deposited into the receiving cavity, the top of the expansion memory being roughly flush to slightly above the outer perimeter of the top case. When the module is inserted into a compatible slot of a host device, the expansion memory is locked into the receiving cavity by the presence of the adjacent wall (or roof) of the slot. The connector spring contacts of the expansion module are depressed by the presence of the expansion memory, thus effecting the mating (electrical continuity) of these contacts with the contacts of the expansion memory.

Figure 23:
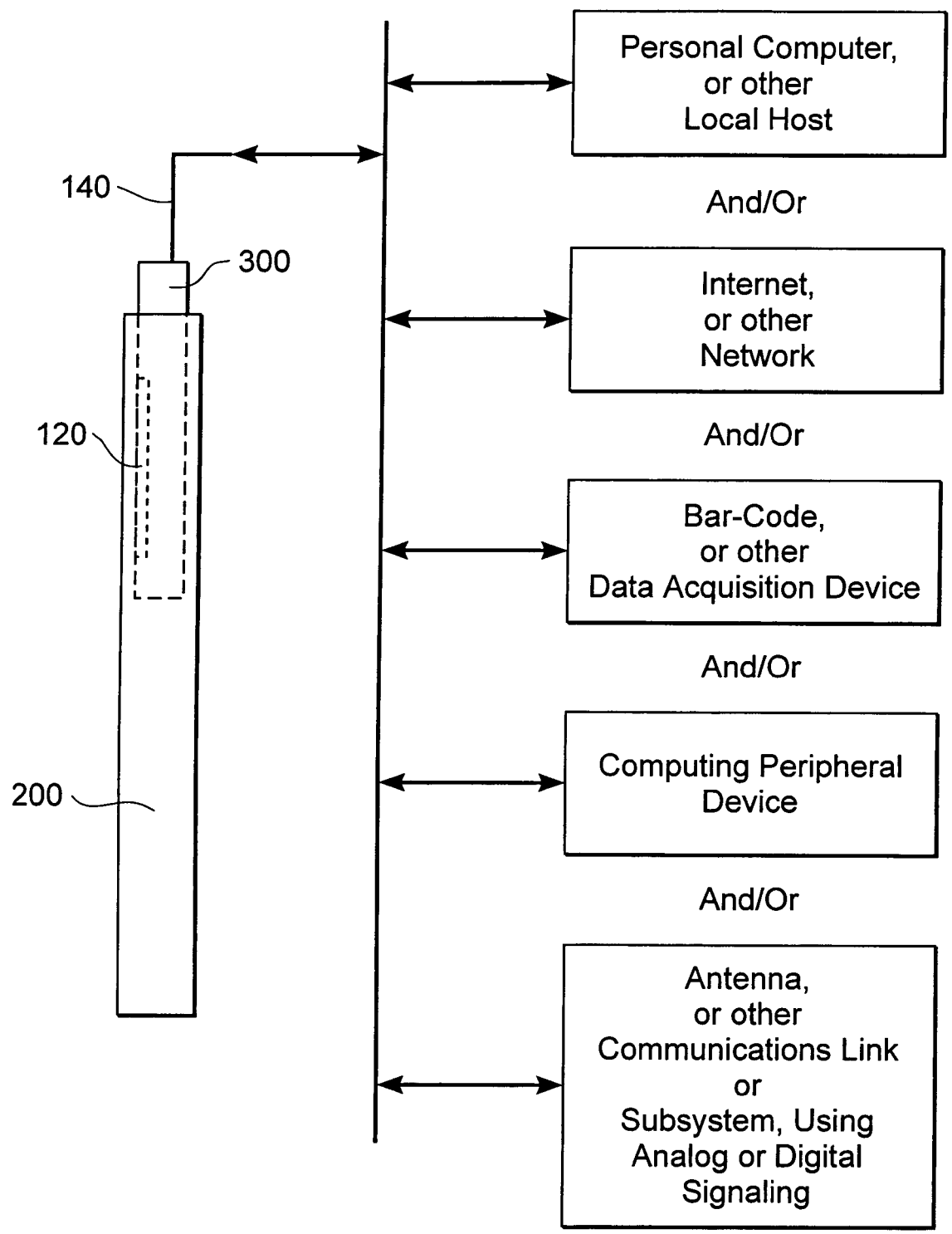
FIG. 23 illustrates a PDA having a closed-back industrial design, equipped with a top-cavity expansion module, and coupled to various types of I/O, in accordance with embodiments of the present invention.
Figure 24:
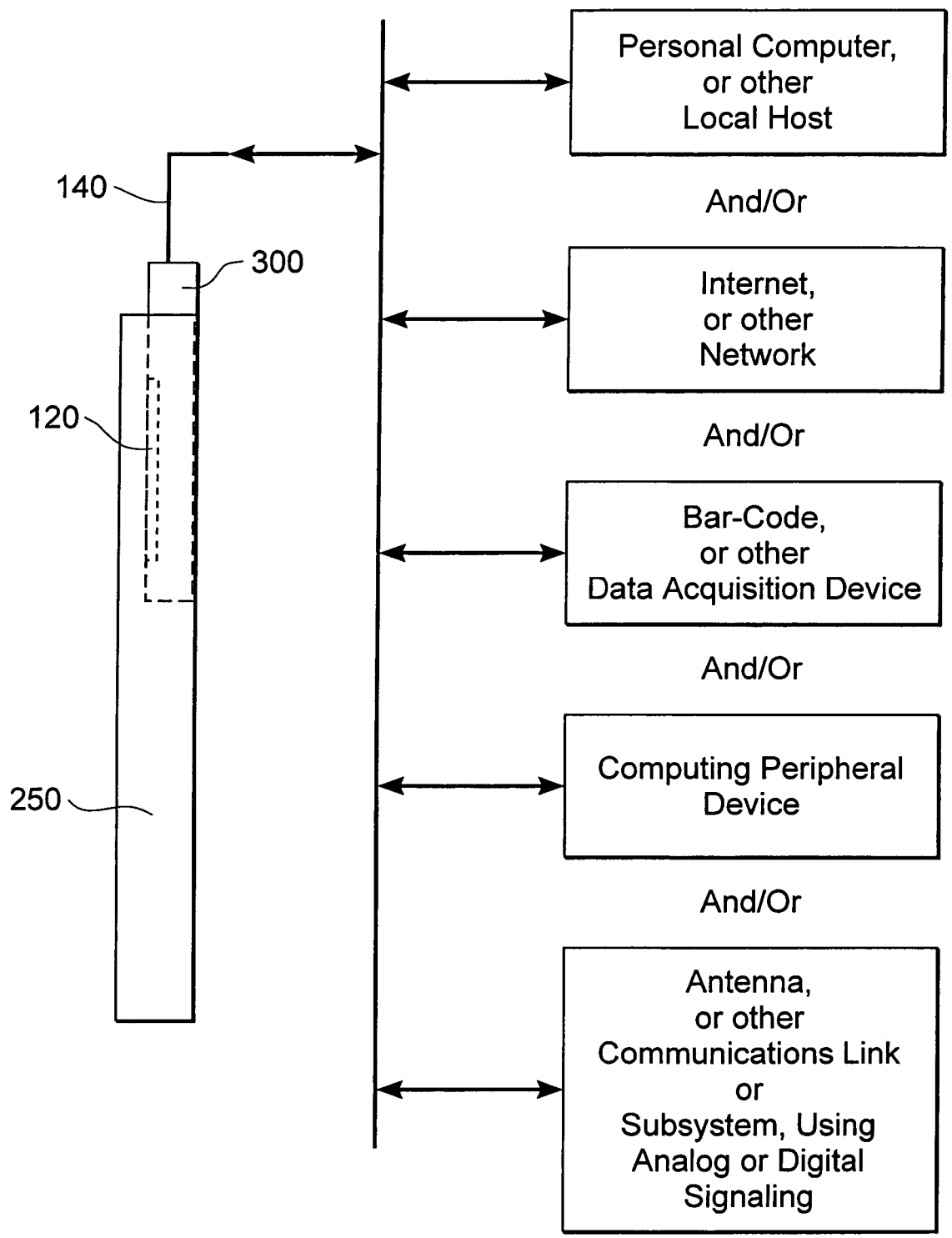
FIG. 24 illustrates a PDA having an open-back industrial design, equipped with a top-cavity expansion module, and coupled to various types of I/O, in accordance with embodiments of the present invention.

The top-cavity expansion module of FIG. 16 and FIG. 17 also has an I/O connector that is accessible for I/O functions, including any of those described herein. FIG. 23 illustrates a PDA having a closed-back industrial design, equipped with a top-cavity expansion module, and coupled to various types of I/O, in accordance with the present invention. FIG. 24 illustrates a PDA having a open-back industrial design, equipped with a top-cavity expansion module, and coupled to various types of I/O, in accordance with embodiments of the present invention.

Circuitry and Functionality of the Expansion Module

In an illustrative embodiment of the invention, circuitry 160 includes I/O adapter circuitry and removable memory adapter circuitry. The I/O adapter functionality may include one or more of, but is not limited to, Ethernet, serial port, audio, telephone, antenna, and special-function interfaces such as bar code and other scanners. The removable memory adapter functionality may include one or more of, but is not limited to, main memory expansion, mass-media emulation, and other host-based special-purpose memory applications.

In accordance with an illustrative embodiment, circuitry 160 further includes application-specific circuitry for which the management of the removable memory is an ancillary function to the primary function of the specific application. Specific examples of such application-specific expansion modules having both I/O and removable memory are provided in later sections.

Figure 1:
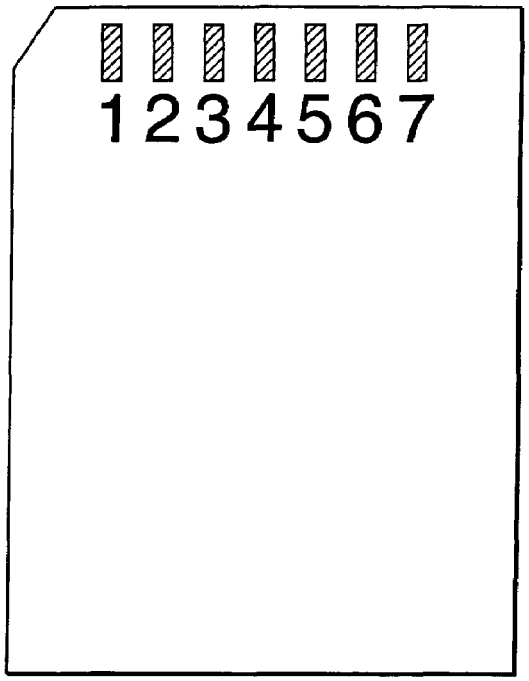
FIG. 1 represents a prior art MultiMediaModule form factor and its pad definitions.
Figure 3:
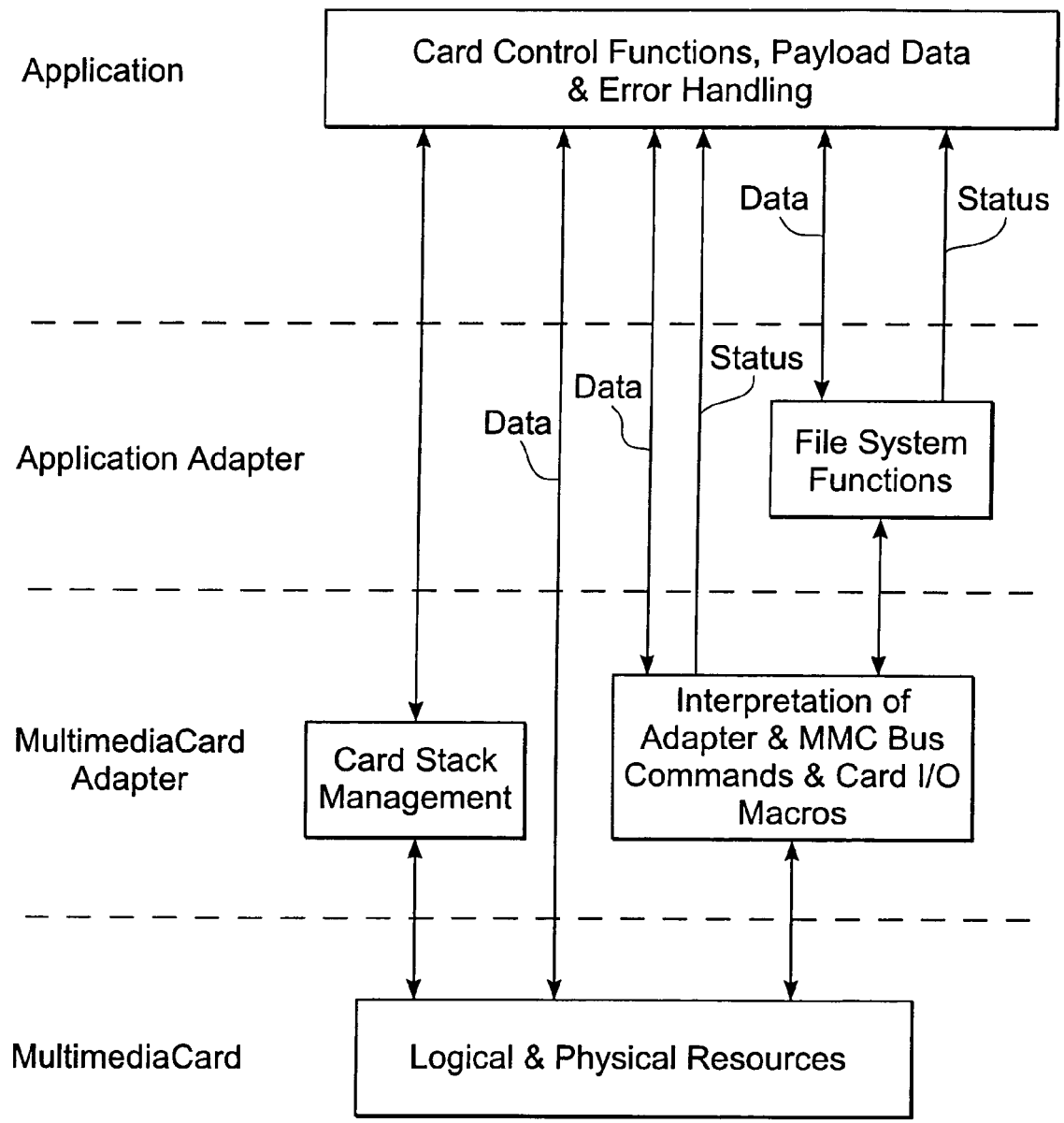
FIG. 3 illustrates the prior art functional partitioning of a generic MultiMediaModule system.
Figure 4:
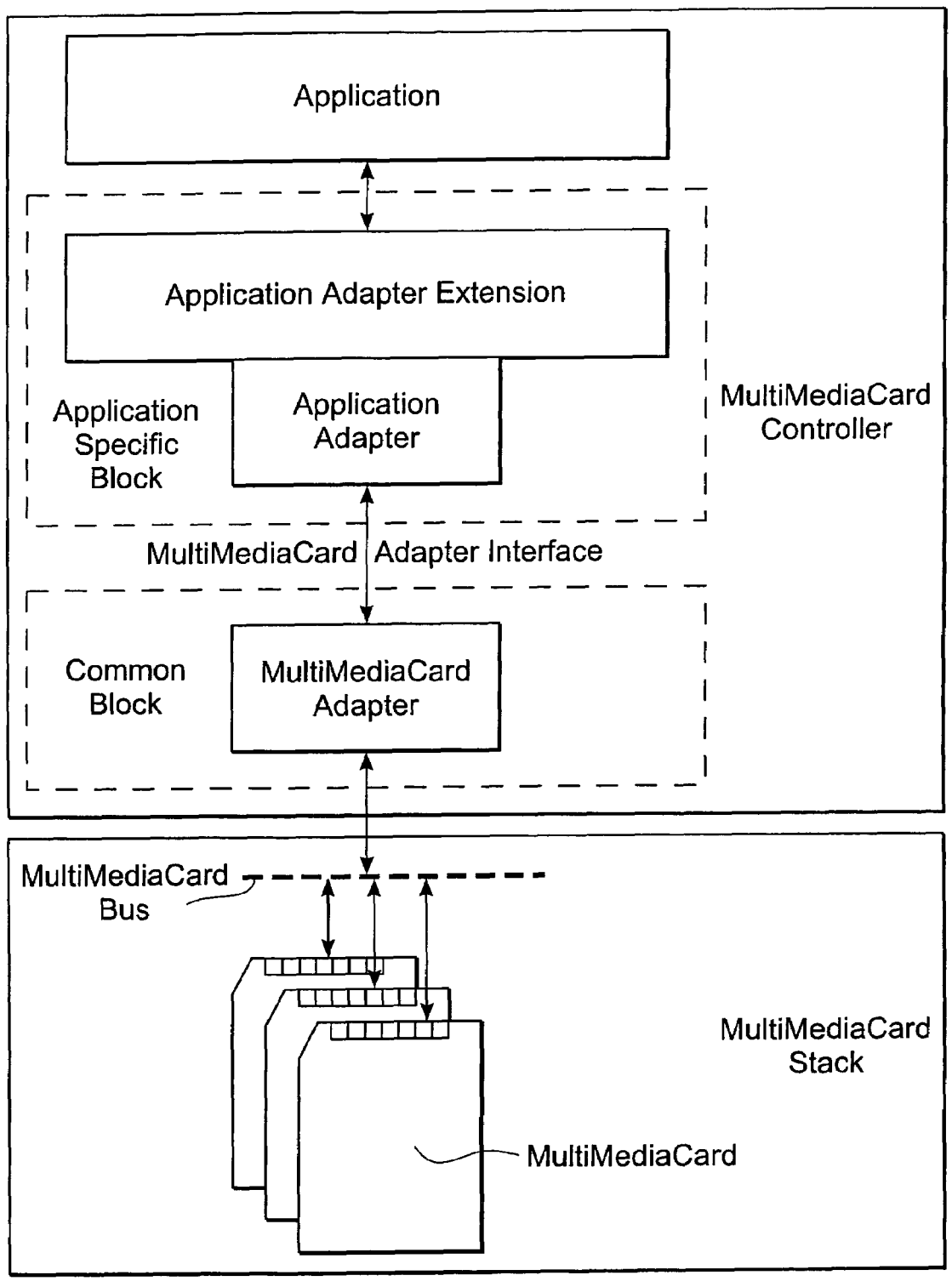
FIG. 4 illustrates the prior art physical partitioning of a generic MultiMediaModule system.
Figure 5A:
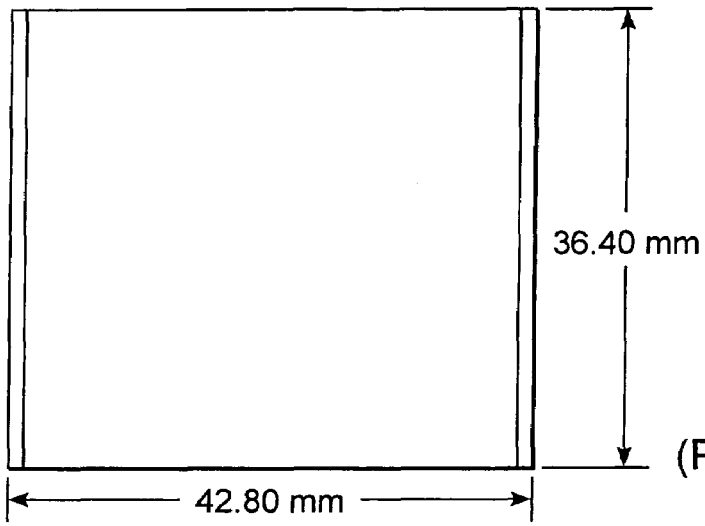
FIGS. 5 and 6 illustrate the form factors of the prior art CompactFlash module and MultiMediaModule, respectively.
Figure 5B:
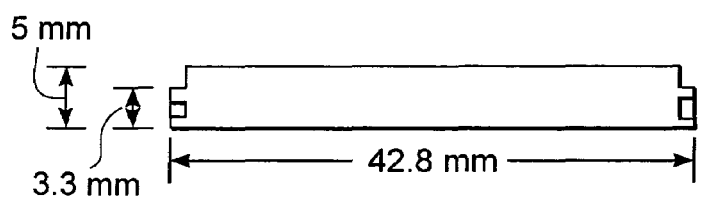
Figure 6A:
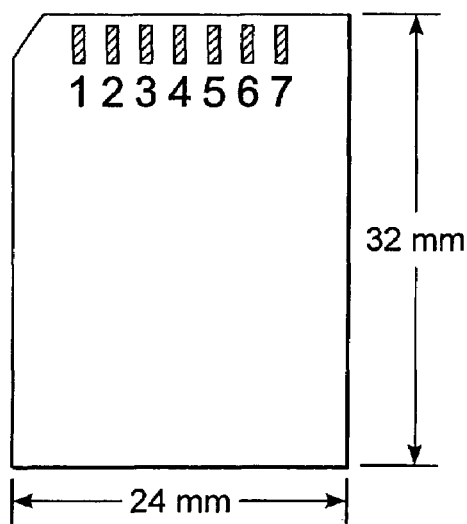
Figure 6B:
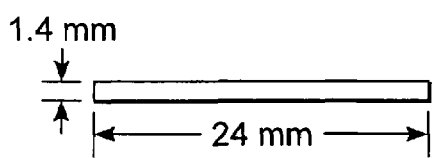

In preferred implementations of the illustrative embodiments mentioned above, the functions performed by the removable memory are those of a MultiMediaModule adapter as illustrated in the MultiMediaModule adapter section of the MultiMediaModule system architecture diagram of FIG. 3. If the removable memory is being used to provide host-base-memory expansion, such as described for the first embodiment, then the host must provide the functionality illustrated by the Application and Application Adapter sections of FIG. 3. If the removable memory is being used at least sometimes as an ancillary memory (at least sometimes private) to the application-specific circuitry contained on the expansion module, such as for the second embodiment, then the application-specific circuitry must provide the Application and Application Adapter section functionality, or else the application-specific circuitry must call on host services for such functionality.

Examples of known techniques for making and using other types of memory adapter circuitry for closed-case expansion modules or with flash memory are found in the previously referenced '145, '426, '584, '774, and '108 patents, among others. Examples of known techniques for making and using I/O adapter and application-specific circuitry for functions implemented in closed-case expansion modules and with flash memory are found in the previously referenced '374, '577, '774, and '108 patents, among others.

Frame Kit Assembly Details

The top and bottom frames may be composed of metal or plastic. In a preferred embodiment, the top and bottom frame portions each have a plastic base augmented with an outer metal plate over much of the interior region of the large panel surface of each portion. The metal plate extends to the edges of the panel at the connector ends of each portion and is attached to both connectors. In addition, smaller metal strips, or ears, on both sides at the finger-grip end (opposite to the host connector) extend from the plate to the edges of the panel and continue onto the sides. The frame kit is assembled and the side strips are sonically welded together on both sides of the casings. The welded strips and plates form a single continuous metal band around the top and bottom frames that permanently physically retains the assembled kit.

I/O Interconnect Options

I/O devices may be interconnected with the expansion module via three different embodiments. First, a connector such as a PC-Module industry-standard Honda-style 15-pin connector may be used with a mating detachable cable. Detachable cables are preferred for light-duty applications where a continuous I/O device connection is neither needed nor desired. Second, a fully integrated fixed cable, having a molded strain relief may be used. Such a fixed cable maintains solid contact in high vibration environments, is protected against lateral stress, and seals out dust. Fixed cables are preferred for dedicated industrial or field applications. Third, at least a portion of the I/O device may be abutted and attached (often via a snap-in-place mechanism) directly to the expansion module, obviating the need for either a detachable or fixed cable. Cableless snap-on I/O devices are preferred for small mostly self-contained I/O devices that permit a compact PDA, expansion-module, I/O-device combination that handles physically as a single piece of equipment. In the instant invention, such snap-on I/O devices must make allowance for the removable memory.

PDA Having Application Specific Module with Removable Media

Figure 18:
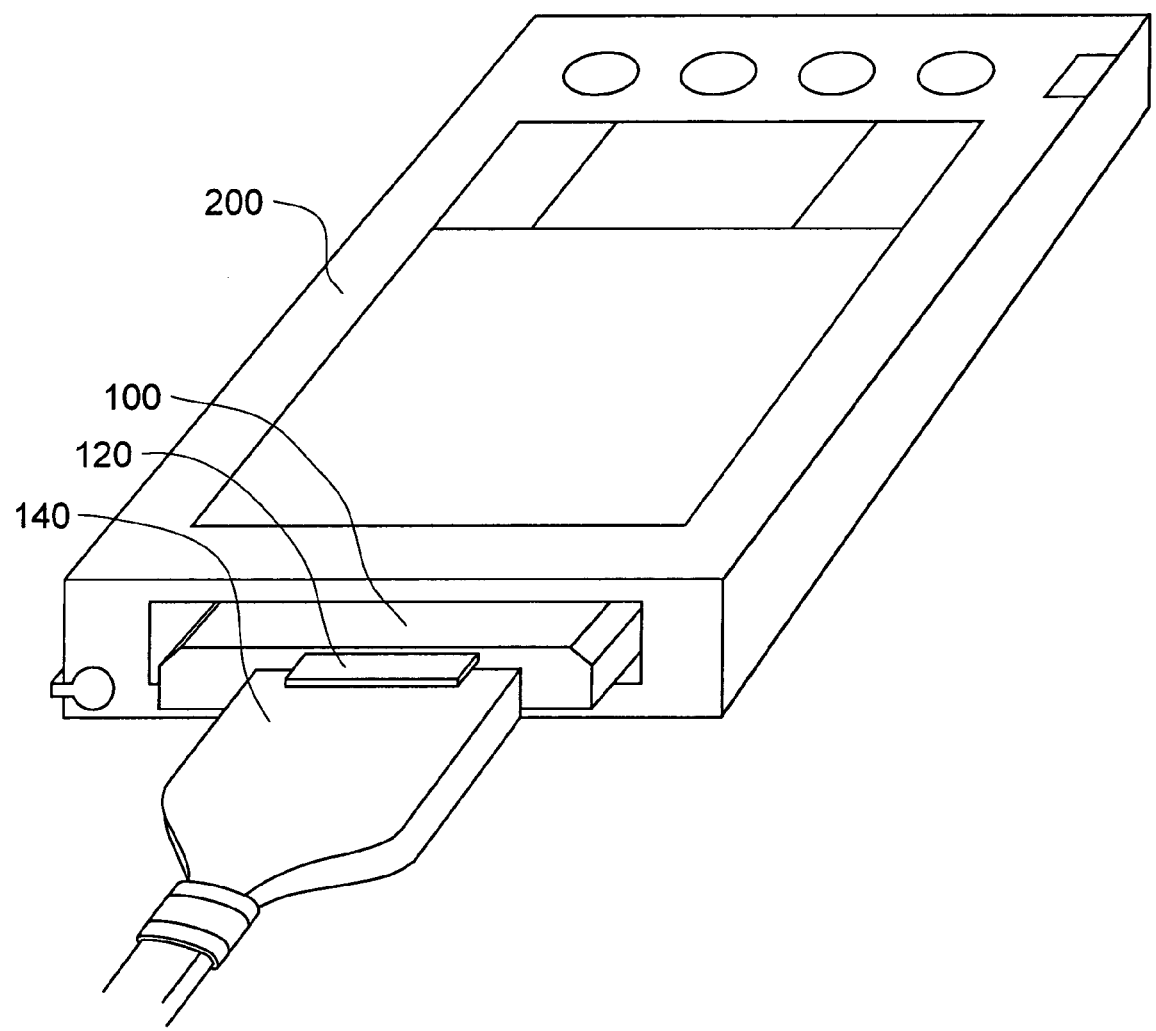
FIG. 18 illustrates a PDA populated with a first-level removable expansion module having I/O and wherein the first-level module is populated with a second-level removable memory in accordance with an embodiment of the present invention.
Figure 19:
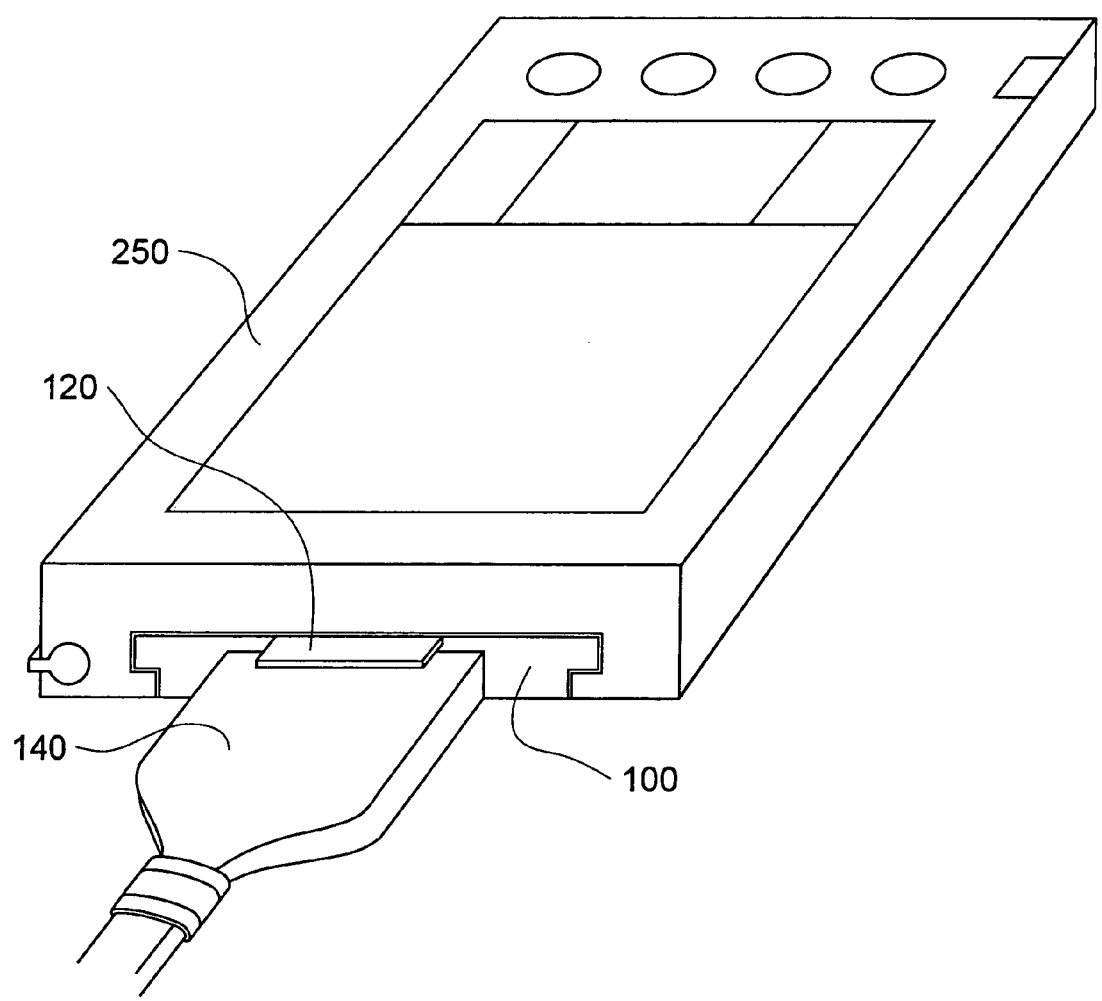
FIG. 19 illustrates a PDA populated with a first-level removable open-face expansion module having I/O and wherein the first-level module is populated with a second-level removable memory in accordance with an embodiment of the present invention.
Figure 21:
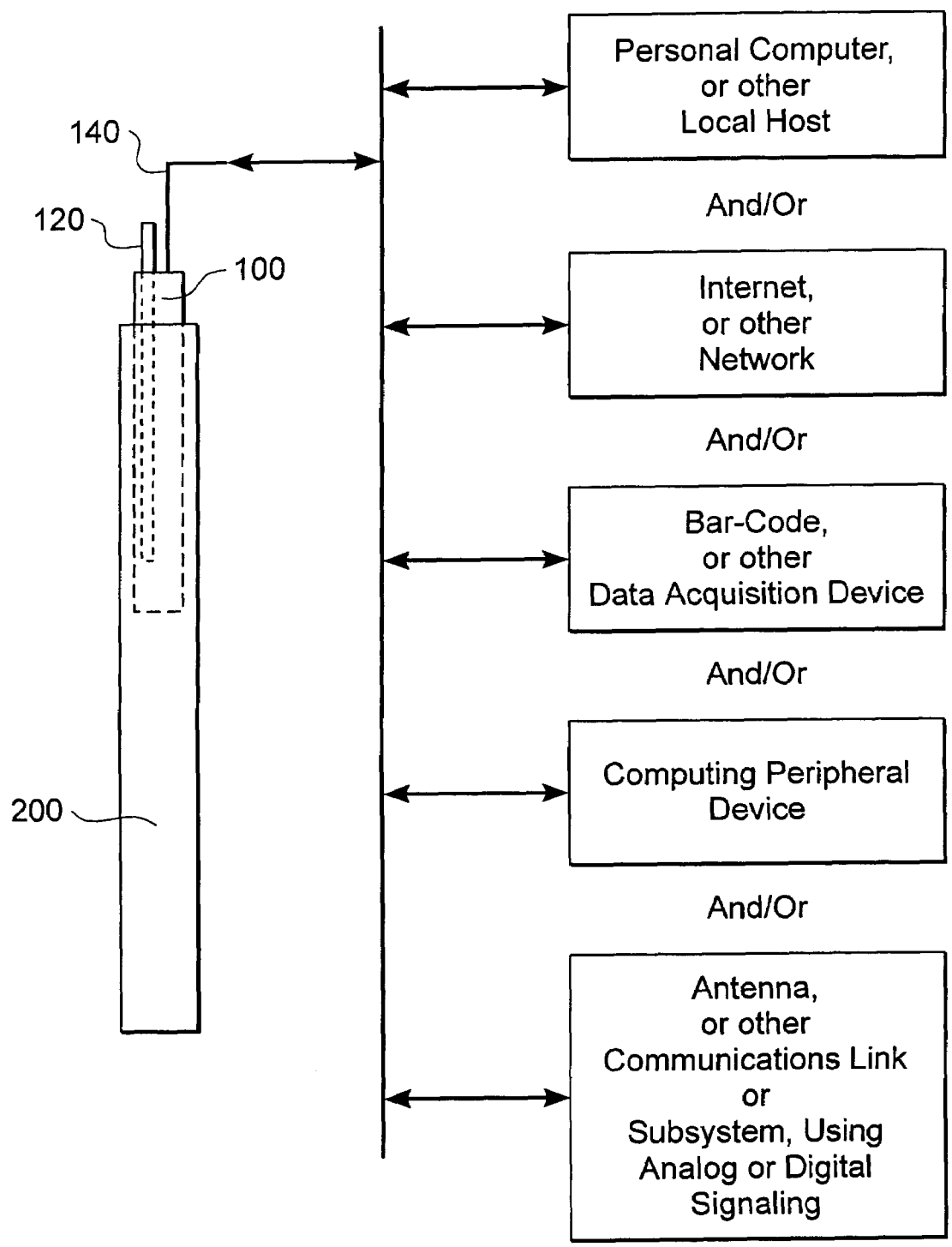
FIG. 21 illustrates some of the various types of I/O for which the PDA and removable expansion module of FIG. 18 may be equipped.
Figure 22:
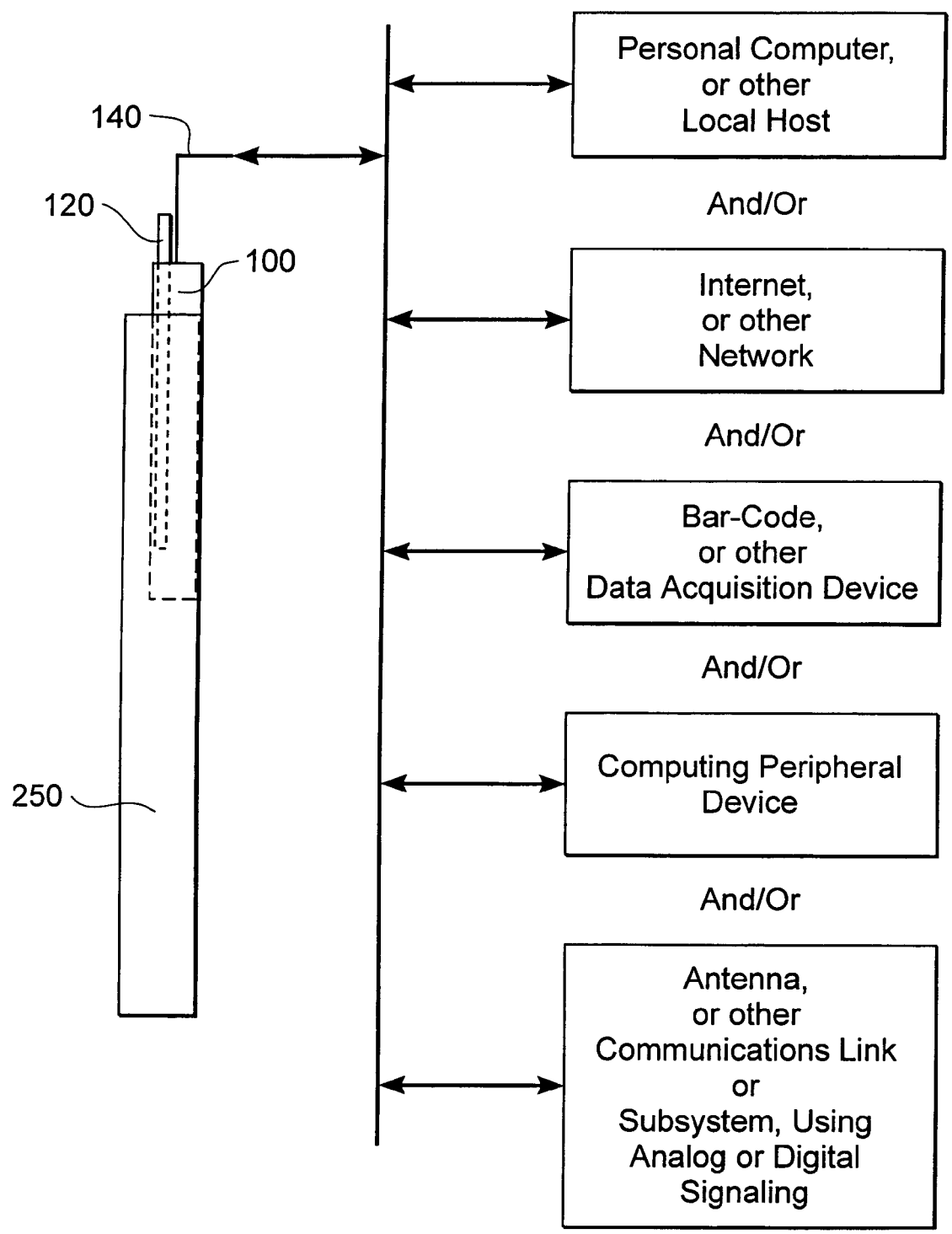
FIG. 22 illustrates some of the various types of I/O for which the PDA and removable open-face expansion module of FIG. 19 may be equipped.

FIG. 18 illustrates a PDA 200 equipped with a removable expansion module 100 having both I/O interconnect 140 and removable memory 120 in accordance with an embodiment of the present invention. The application specific circuitry of the expansion module may be used in conjunction with application specific software running on the PDA. This permits the application specific circuitry of the expansion module to make use of the output (e.g., display, sound) and input (e.g., tablet, buttons, any I/O ports) capabilities of the PDA for user interface functions associated with the specific application. In particular the PDA's display/input-tablet provides for virtual controls and visual indicators for the application. FIG. 21 illustrates some of the various types of I/O for which the PDA and removable expansion module of FIG. 18 may be equipped. Application-specific functions may include special-function digital, analog, and mixed-signal electronics; special-function I/O; special-function data-pumps; and special-function accelerators.

Expansion Module Based O/S Related Functions

Techniques are known in the art for making and using systems that perform O/S related functions in conjunction with expansion modules. These techniques include: software enabled hot-swapping of expansion modules; auto launch of application programs specific to the inserted module; and "plug and play" ease of use via dynamic load of associated drivers on module insertion and dynamic unload of the associated drivers on module removal. Preferred embodiments of the application-specific expansion modules discussed herein will generally make use of these O/S related techniques. Unlike prior art systems, systems designed in accordance with embodiments of the present invention will generally need to manage both I/O and memory device drivers.

Modes of Use and Potential for Increased Parallelism

Removable expansion modules according to embodiments of the present invention may operate in a number of different modes. At a basic level, they may be used solely to interface an external peripheral to the host device via the I/O connector, they may be used solely to interface a second-level-removable expansion memory with the host device, and they may be used to simultaneously interface the host device with both an external peripheral and an expansion memory.

Figure 26:
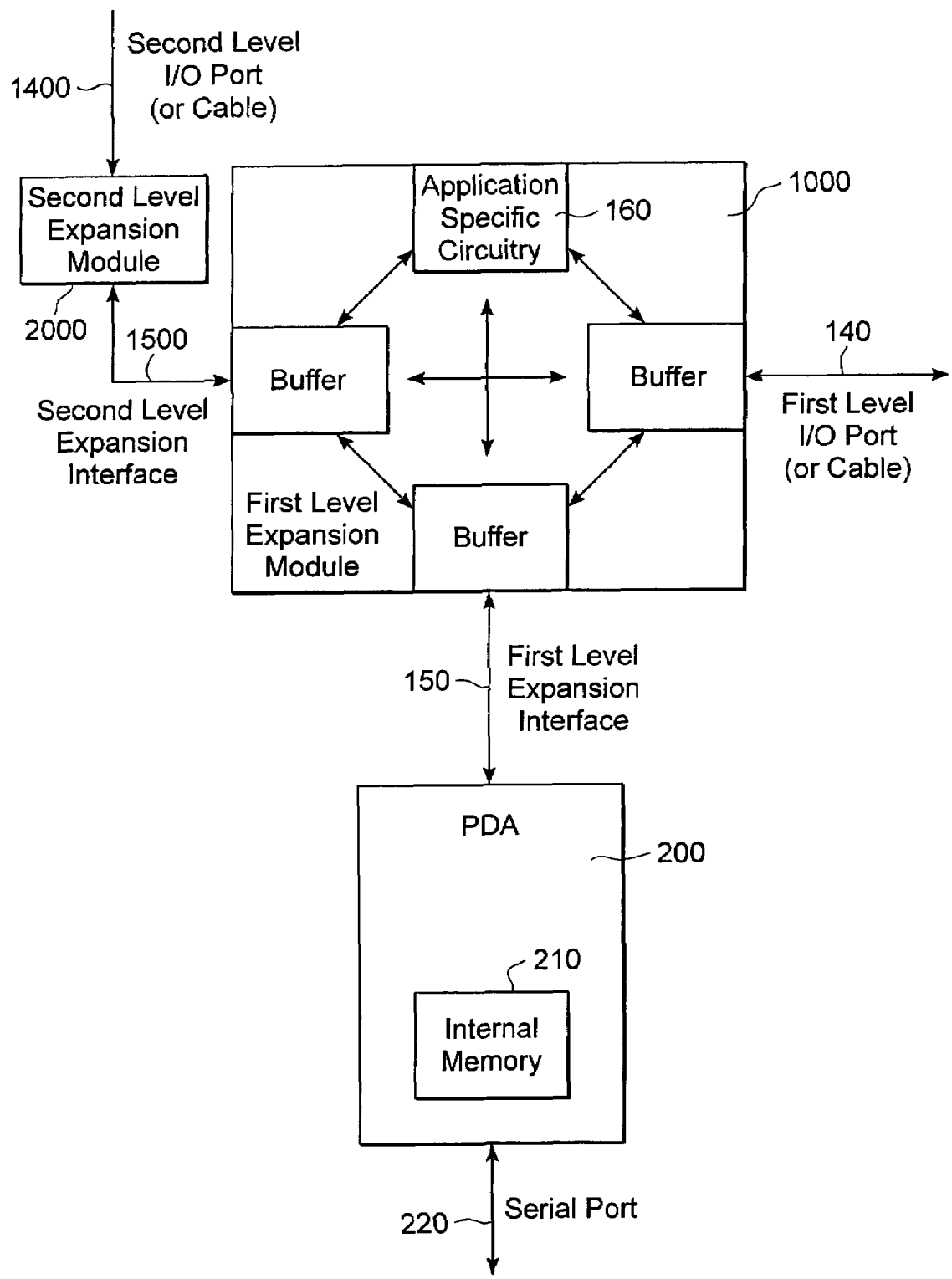
FIG. 26 illustrates a PDA and expansion module in accordance with a "fully connected" implementation of the present invention.

At a more general level, more advanced modes of operation are also possible. In a specific, but not limiting illustrative embodiment, FIG. 26 shows a PDA 220, a first-level expansion module 1000, and a second-level expansion module 2000, in accordance with a "fully connected" implementation of the present invention. The expansion module 1000 of FIG. 26 includes six major data transfer paths capable of simultaneous operation; application specific circuitry 160; and data buffers at the first-level expansion interface 150, the second-level expansion interface 1500, and the I/O port (plugged-wired, corded-wired, or wireless) 140. Each of the data buffers generally has one or more stages of FIFO storage for each data path coupled to each buffer. The inclusion of any of the data buffers, the extent of FIFO buffering, the existence of any particular one of the data paths, and management of bridging transfers by the circuitry in the expansion module, are specific to a given application. The second-level expansion module 2000, may include be of a variety of types, including SSD modules having a second-level I/O port (plugged-wired, corded-wired, or wireless) 1400.

Prior art PDAs 200 (or 250) have limited modes of use and can generally affect significant data transfers only between any of their integral main memory 210, integral serial port 220, and integral expansion module bus 150. The addition of prior art expansion modules to PDAs does not alter the number of significant data transfer paths or number of significant simultaneous data transfers. Clearly, the expansion module 1000 of FIG. 26 greatly increases the potential system-level parallelism over that of the prior-art.

Application-Specific Embodiments

Generic Removable-Media Applications

The present invention enables general-purpose portable hosts to perform application-specific functions requiring dedicated ROM. A first large ROM-based application category is that of prerecorded media, such as music, audio, video, and text (for books, newspapers, and other publications). A second large ROM-based application category is customization for programmable devices, such as games, language translators, and other devices having "personality" modules.

The present invention also enables general-purpose portable hosts to perform application-specific functions requiring non-volatile read/write memory for data-capture, data-logging, data-checkpoints or backups, transaction logging, and data-transport.

In the illustrated embodiments the non-volatile read/write memory is flash memory in accordance with the standard MultiMediaModule. Such removable flash-memory-based application-specific functions have particular utility to medical and other data acquisition, secure commerce, financial and personal productivity devices making use of unique removable memories for each of multiple individuals, projects, or accounts.

The removable flash-based memory is also well suited where "sneaker-net" is a viable data transport. Provided manual/user intervention is acceptable, and depending on the speed of data link I/O incorporated into the expansion module, the physical transport of a removable memory device between a PDA-based expansion module and an external system may provide the best solution to fast local transport of large data-sets. For similar reasons, the use of removable memory devices may provide the best solution to rapidly reconfiguring an application-specific expansion module to initiate a large program or use a large data sets. The use of labeled, color-coded, or otherwise distinctive, removable memory devices also may provide the best solution for ease of use for users needing to select a particular program or data set from many for reconfiguring an application-specific expansion module.

Generic Removable I/O in Removable I/O Applications

Figure 20:
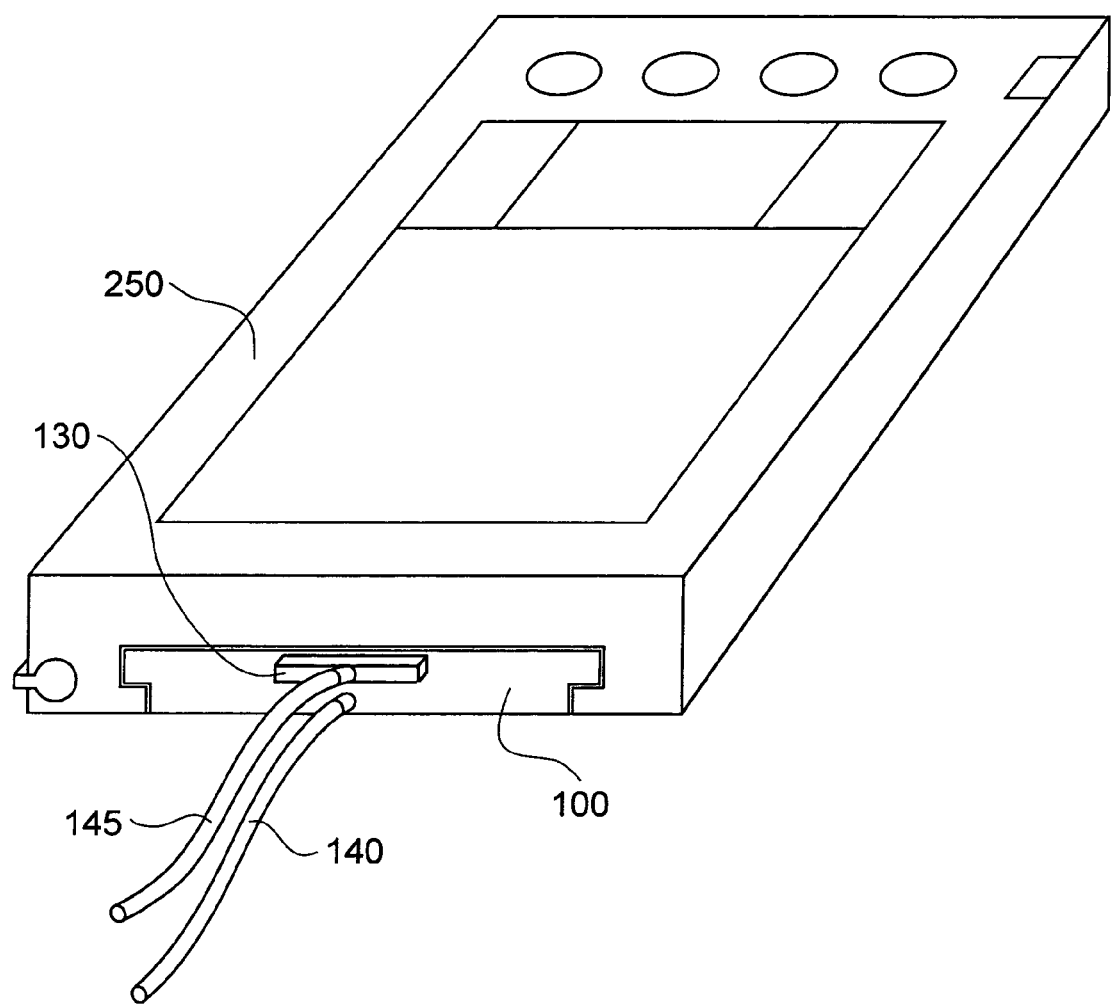
FIG. 20 illustrates a PDA populated with a first-level removable open-face expansion module having I/O and wherein the first-level module is populated with a second-level removable expansion module having memory and I/O in accordance with an embodiment of the present invention.
Figure 25:
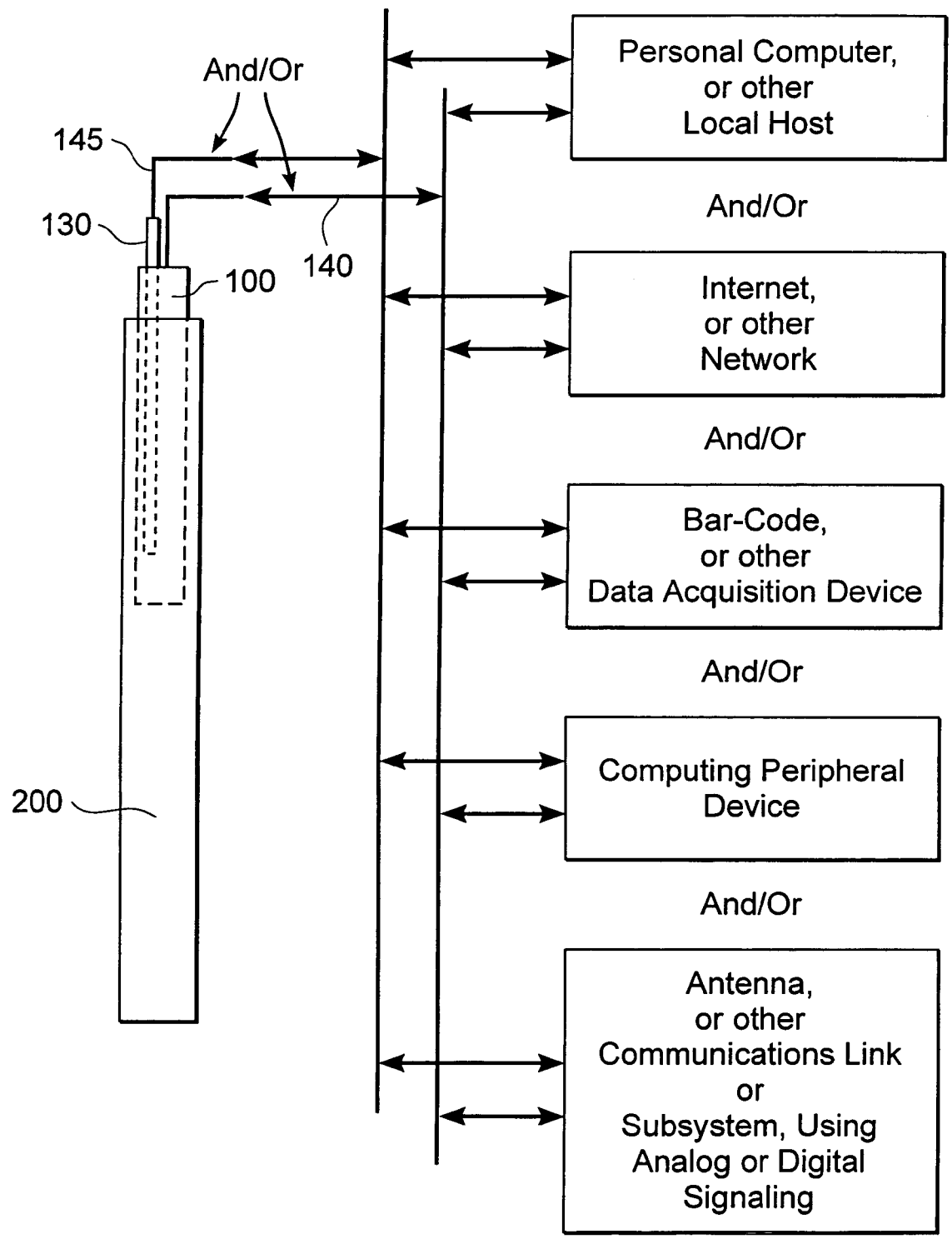
FIG. 25 illustrates some of the various types of I/O for which the PDA and removable expansion module of FIG. 20 may be equipped.

As shown in FIGS. 20 and 25, the present invention enables general-purpose portable hosts to perform a first application-specific I/O function in a first-level removable module having a slot for a second-level removable module for performing a second application-specific I/O function via a second-level I/O coupling 145. Removable I/O functions generally include direct peripheral connections (such as pointing, keyboard, bar-code scanners, printing, or video/imaging/display devices), peripheral expansion buses (such as USB, Firewire, or SCSI), networking (such as Ethernet, Bluetooth, and other shared media methods), or communications (such as modems, serial devices, and other data communication methods).

Connectivity is an increasingly important application class of I/O functionality for portable hosts. Specific connectivity scenarios include: portable-to-mobile phone, portable-to-portable(s), portable-to-desktop, portable-to-network, portable-to-peripheral, and portable-to-embedded system. "Removable-in-removable" configurations enabled by the present invention permit simultaneous realization of a plurality of connectivity scenarios.

Specific Application Examples

Media Player Application

An embodiment of the present invention permits a general purpose PDA to be customized (specially adapted) for use as a portable/wearable media player, at the highest-level of functionality not unlike a portable Compact Disk player. Such a player uses the removable memory to store and playback digitally encoded media such as music, audio, or video. In a preferred embodiment the player makes use of the MPEG Layer 3 standard for digital audio encoding, generally known as MP3. Another embodiment makes use of the Microsoft Digital Audio standard. Other aspects of a specific embodiment include an integral AM/FM receiver, a connector for a headset with an integral antenna for the receiver, and an auto-start on insert feature that initiates the media playback upon insertion of the removable memory. The PDA's display/input-tablet provides the virtual controls and visual indicators for the media player.

Module For Subscriber Services

In accordance with an embodiment of the present invention, an expansion module having I/O and removable memory is inserted into a computer host. The I/O is coupled to a receiver capable of receiving a large number of broadcast messages and services. The removable memory contains subscriber services information for each individual user. The expansion module uses the subscriber services information to filter out messages and services not applicable to the present status of the subscriber. The PDA's display/input-tablet provides the virtual controls and visual indicators for the display and access of captured messages and services.

Bar-Code Scanning Application (A Backup Storage Example)

In accordance with an embodiment of the present invention, an expansion module having I/O and removable memory is inserted into a computer host, a bar-coding peripheral is connected to the I/O portion of the module, and a removable memory module is inserted into the memory slot of the module. After each scan the scanned information is transferred through the I/O connection to the host computer for processing. Additionally, a backup copy of the scanned information is stored on the removable memory. Should the computer host fail or should the operator need to verify scans, the backup can be interrogated with the same or a different host.

Personal Environmental and Medical Monitoring Devices

An embodiment of the present invention permits a general purpose PDA to be customized as a portable/wearable personal environmental monitor. Equipped with the appropriate sensors and application-specific circuitry for sensor signal processing, such a device performs time-stamped data logging of environmental attributes such as ionizing radiation, temperature, and humidity. Similarly, a portable/wearable personal media monitor data logs health-related attributes such as pulse, temperature, respiration, and blood pressure. The PDA's display/input-tablet provides the virtual controls and visual indicators for the monitoring devices.

Automotive and Industrial Diagnostic Monitoring and Control

The combined I/O interconnect and removable memory of embodiments of the present invention also permits a general purpose PDA to be customized for use as a data logging diagnostic monitor or time-based control device. It is known that the diagnostic connectors of certain vehicles can be adapted to interface with PDAs for real-time monitoring of critical vehicle subsystems. The present invention permits such diagnostic monitoring data to be communicated via the I/O interconnect and logged to the removable memory. Such a tool facilitates tracking subsystem performance over extended periods of time, and permits real-time and deferred graphics of time-varying system performance attributes. The PDA's display/input-tablet provides the virtual controls and visual indicators for the diagnostic monitor.

Miscellaneous Removable Memory Applications

Another example application is wireless-modem based (I/O serial data-com link to cell-phone) Web-browsing (digital modem data transferred over expansion bus interface) while simultaneously playing back stored music (data from expansion memory interface transferred over expansion bus interface). A final example application is receiving location data (I/O data-com link to GPS receiver), retrieving map data (via expansion memory interface), and PDA display of integrated map and location data (I/O and memory data transferred over expansion bus interface).

Exemplary Removable I/O in Removable I/O Application

A first-level removable I/O module provides a corded interface to a mobile phone acting as a wireless modem to a remote network (such as the Internet). A second-level SSD-compliant removable I/O module, inserted into the first-level module, provides an interface to a Bluetooth-based local network with multiple devices. The first-level removable I/O and the second-level removable I/O are configured to provide a gateway between the two networks, enabling remote network access for any of the multiple devices in the Bluetooth local network.

CONCLUSION

The expansion module of the present invention enables general-purpose portable hosts having a single native expansion slot to achieve a first-level expansion function (generally having I/O) in simultaneous conjunction with a second-level removable module. In one use of such a combination, the second-level removable module may have little or no interrelationship with the first-level expansion function. Thus a second-level removable memory (or I/O function) may be dedicated to the system or application software running on the host, either directly, e.g., as some portion of the main-memory of the host, or indirectly as an emulation substitute for host mass-storage (i.e., disk drives).

Moreover, embodiments of the present invention also enable system approaches wherein the second-level removable module is interrelated to the first-level expansion function. Specifically, a first-level removable expansion module having I/O functionality may have private (or shared) access to a second-level removable expansion module (generally having memory and/or I/O functionality). The present invention thus enables portable computer hosts, such as PDAs, to be used as customizable platforms for many application-specific functions that require a removable module dedicated to the application.

Although the present invention has been described using particular illustrative embodiments, it will be understood that many variations in construction, arrangement and use are possible within the scope of the invention. For example the number of I/O interconnects, removable memories, contact fingers, number and type of application-specific circuits, and the size, speed, and type of technology used may generally be varied in each component of the invention.

The invention is further not limited to the specific expansion module technology of the illustrative embodiments. In specific but not limiting examples, the invention is equally applicable to any of the present and future variants of the CompactFlash (including any of the Type I, Type II, and proposed Type III variants), PC Module (including any of the 32-bit, 16-bit, Type I, Type II, and Type III variants), and Springboard (or other open-back expansion module) standards, as well as other removable expansion module standards and technologies.

Nor is the invention limited to a specific number and type of expansion I/O connector and I/O signaling as used in the illustrative embodiments. The invention is equally applicable to the use of multiple I/O connectors of one or more connector types. In addition, various and multiple types of I/O signaling may be employed.

Nor is the invention's second-level removable expansion memory limited to the MultiMediaModule expansion memory standard of the illustrative embodiments, but is equally applicable to use of other types of second-level removable memory or media. In specific but not limiting examples, the invention is equally applicable to the use of present and future variants of MMCs, SDs, SSDs, Miniature Modules, SSFDCs, Smart Modules, and SIM Modules.

At the system level, the invention is not limited to the illustrated embodiments in which a removable expansion module with second-level-removable expansion memory is directly plugged into a computing host, but is equally applicable to situations in which one or more intervening adapters or "dongles" is used to adapt or couple between the interfaces of the expansion module and a computing host device or system. In a specific but not limiting example, the invention is applicable to the use of a CF Module with a CF-to-PC Module adapter, so that a CF Module according to the present invention can operate indirectly in a PC Module slot.

At the system level, the invention is also not limited to the illustrated embodiments in which a removable expansion module with second-level-removable expansion memory is used in a PDA, but is equally applicable to use in any host device or system benefiting from the use of a removable expansion module having second-level-removable expansion memory. In specific but not limiting examples, the invention is equally applicable to present or future variants of desktops, servers, workstations, network computers, laptops, notebooks, palmtops, handheld computers (handhelds), information appliances, audio recording and playback devices, imaging devices including scanners and digital cameras, video recorders, fax machines, copy machines, smart phones, point-of-sale terminals, bar-code scanners, other special purpose data-acquisition devices, printers, other special purpose data-output devices, communication systems, network interface or networking infrastructure devices operating at any one or more levels of a data-communications protocol stack, network systems including any of the foregoing devices, and systems implementing networks and network applications at any scale including networks characterized as local area, departmental, enterprise wide, metropolitan area, state wide, regional, national, and the Internet.

More generally, functionally equivalent techniques, now known or that become known to those skilled in the art, may be employed to implement various components in place of those illustrated. The present invention is thus to be construed as including all possible modification and variations encompassed within the scope of the appended claims.

What is claimed is:

1. A removable expansion module for a portable host, referred to as the first-level module, for engagement with a portable host when inserted into an opening in the host, the first-level module comprising:
   an expansion module frame and a PCB;
   a host-interconnect for coupling with the host when the first-level module is inserted in the opening in the host;

an I/O interconnect for coupling with an external I/O device;

I/O adapter circuitry for the I/O device;

a second-level interconnect for coupling with a second-level expansion module; and second-level adapter circuitry coupled to the second-level interconnect;

wherein the first-level module has an opening sized and positioned to allow insertion of the second-level expansion module into the opening so as to engage the second-level interconnect while the first-level module is engaged with the portable host, and to allow withdrawal of the second-level expansion module from the opening so as to disengage from the second-level interconnect while the first-level module is engaged with the portable host.

2. The module of claim 1, wherein the module is a CompactFlash module.

3. The module of claim 1, wherein:
the second-level expansion module is a removable memory;
the second-level interconnect is compatible with a MultiMediaModule; and
the second-level adapter circuitry is MultiMediaModule adapter circuitry.

4. The module of claim 1, wherein the I/O adapter circuitry is a serial I/O adapter and the I/O-interconnect includes a cable having a standard serial connector.

5. The module of claim 1, wherein the I/O adapter circuitry is a local area network adapter and the I/O-interconnect includes a cable having a standard local area network connector.

6. The module of claim 1, wherein the I/O adapter circuitry is a parallel adapter and the I/O-interconnect includes a cable having a standard parallel connector.

7. The module of claim 1, wherein the I/O-interconnect is a Honda-style 15-pin connector integral to the module.

8. The module of claim 1, wherein the module is designed to abut and fasten with at least part of the I/O device such that the I/O-interconnect for coupling with the I/O device is cableless.

9. The module of claim 1, wherein:
circuitry on the PCB includes decoder and reconstruction circuitry for digitally encoded media, the decoder and reconstruction circuitry having analog electronics for providing a first low-level analog signal output; and
the second-level expansion module is a removable memory holding at least one digitally encoded instance of at least one media type.

10. The module of claim 9, wherein the module is a CompactFlash module.

11. The module of claim 9, wherein:
the second-level expansion module is a removable memory;
the second-level interconnect is compatible with a MultiMediaModule; and
the second-level adapter circuitry includes MultiMediaModule adapter circuitry.

12. The module of claim 9, wherein the digitally encoded media is encoded in accordance with the MP3 standard.

13. The module of claim 9, wherein the digitally encoded media is encoded in accordance with the Microsoft Digital Audio standard.

14. The module of claim 9, wherein the playback of the digitally encoded media is initiated automatically upon insertion of the removable memory.

15. The module of claim 9, wherein the module further includes:
a radio-frequency receiver providing a second low-level analog signal output;
a low-level selector coupled to the first and second low-level analog signal outputs and providing an input to the analog electronics; and
antenna coupling electronics associated with the media output for use with a headset designed to function as an antenna for the radio-frequency receiver.

16. The module of claim 9, wherein the module further includes a local area network adapter.

17. The module of claim 16, wherein the local area network adapter is an Ethernet adapter.

18. The module of claim 1, wherein:
the I/O adapter circuitry includes serial I/O circuitry;
the I/O interconnect includes a serial I/O interconnect compatible with the serial I/O of a digital telephone;
the second-level expansion module is a removable memory holding data including address book records;
the serial I/O interconnect provides communication between the telephone and the module of the data associated with the removable memory; and
the second-level adapter circuitry includes removable memory adapter circuitry for interfacing with the removable memory.

19. The module of claim 1, wherein:
the I/O adapter circuitry includes serial I/O circuitry;
the I/O interconnect includes a serial I/O interconnect compatible with the serial I/O of a digital telephone;
the second-level expansion module is a removable memory for holding data including digitally encoded telephone communications;
the serial I/O interconnect provides communication between the telephone and the module of the data associated with the removable memory; and
the second-level adapter circuitry includes removable memory adapter circuitry for interfacing with the removable memory.

20. The module of claim 1, wherein:
the I/O adapter circuitry includes serial I/O circuitry;
the I/O interconnect includes a serial I/O interconnect compatible with the serial I/O of a digital telephone;
the second-level expansion module is a removable memory holding data including address book records and digitally encoded telephone communications;
the serial I/O interconnect provides communication between the telephone and the module of the data associated with the removable memory; and
the second-level adapter circuitry includes removable memory adapter circuitry for interfacing with the removable memory.

21. The module of claim 1, wherein:
an expansion module frame and PCB;
the I/O adapter circuitry includes serial I/O circuitry;
the I/O interconnect includes a serial I/O interconnect compatible with the serial I/O of a GPS receiver;
the second-level expansion module is a removable memory holding data including map information;
the serial I/O interconnect provides communication between the GPS receiver and the module of the data associated with the removable memory; and
the second-level adapter circuitry includes removable memory adapter circuitry for interfacing with the removable memory.

22. The module of claim 21 wherein the map information includes information about city streets.

23. The module of claim 1, further including application-specific circuitry, and wherein the second-level module is a private removable memory for the application-specific circuitry, the management of the removable memory being an ancillary function to the primary function of the specific application.

24. The module of claim 23, wherein the I/O adapter circuitry is coupled to the application-specific circuitry and is not coupled to the PDA.

25. A method of digitally encoded media playback, the method comprising:
providing a PDA having a display, input devices, and a first slot including an associated first-level expansion interface;
providing an expansion module for the PDA, the expansion module having playback circuitry for the digitally encoded media;
inserting the expansion module into the first slot and operatively coupling the expansion module to the first-level expansion interface in the PDA;
providing a second slot in the expansion module for receiving a removable memory, the second slot including an associated second-level expansion interface;
providing the removable memory;
inserting the removable memory into the second slot and operatively coupling the removable memory to the second-level expansion interface;
providing I/O coupling from the PDA to an external system;
transferring the digitally encoded media from the external system to the PDA;
transferring the digitally encoded media from the PDA to the expansion module through the first-level expansion interface;
storing the digitally encoded media from the expansion module to the removable memory;
after storing, later reading the digitally encoded media from the removable memory through the second-level expansion interface, decoding the digitally encoded media, and producing a reconstructed media;
coupling the reconstructed media to a media output of the expansion module, and
providing application software for the PDA to provide user interface functions using the display and input devices of the PDA for controlling the storing and playback of the digitally encoded media.

26. The method of claim 25, wherein the I/O coupling includes a local area network connection and the external system includes an Internet web-site.

27. The method of claim 25, wherein the digitally encoded media is encoded in accordance with the MP3 standard.

28. The method of claim 25, wherein the digitally encoded media is encoded in accordance with the Microsoft Digital Audio standard.

29. The method of claim 25, wherein the playback of the digitally encoded media is initiated automatically upon insertion of the removable memory.

30. A method of customizing a PDA for an application-specific function, the method comprising:
providing a PDA having a display, input devices, and a first slot including an associated first-level expansion interface;
providing an expansion module for the PDA, the expansion module having application-specific circuitry;
inserting the expansion module into the first slot and operatively coupling the expansion module to the first-level expansion interface in the PDA;
providing a second slot in the expansion module for receiving a removable memory;
providing removable memory adapter circuitry within the expansion module for the removable memory, the second slot including an associated removable-memory interface;
providing the removable memory to the expansion module, reading and writing the removable memory by the removable memory adapter circuitry in accordance with the application-specific function; and
providing application software for the PDA to provide user interface functions using the display and input devices of the PDA for controlling the application-specific function.

31. The method of claim 30, further including:
providing an I/O adapter within the module;
providing I/O coupling from the I/O adapter to an external system; and
transferring data between the external system and the I/O adapter.

32. The method of claim 31, further including transferring the data between the I/O adapter and the PDA.

33. The method of claim 32, wherein at least one of the PDA and the module have at least a first and a second power mode and a message received over the network by the module selectively results in a transition from the first power mode to the second power mode.

34. The method of claim 33, wherein at least one of the PDA and the module have at least a first and a second power mode and a message received over the communications link by the module selectively results in a transition from the first power mode to the second power mode.

35. The method of claim 31, wherein:
the I/O adapter is a network adapter;
the I/O coupling includes a network connection; and
the external system includes a web-site.

36. The method of claim 31, wherein:
the I/O adapter is a communications receiver;
the I/O coupling includes a communications link; and
the external system includes a communications transmitter.

37. The method of claim 31, wherein at least part of the external system is abutted and fastened to the expansion module such that the I/O coupling is cableless.

38. A slot assembly for a removable expansion module, the slot assembly defining an opening, referred to as the slot, sized to accommodate an inserted device, the slot assembly comprising:
a PCB;
an I/O connector mounted on the PCB providing a first partial bottom of the slot;
a guide/connector assembly mounted on the PCB, the guide/connecter assembly having connector fingers disposed to make electrical contact with the inserted device, the guide/connecter assembly also providing a second partial bottom of the slot, rear sides of the slot, and a slot back stop;
an upper outside frame of the expansion module frame providing front sides of the slot; and
the lid of the expansion module providing the top of the slot.

39. A first-level removable expansion module for a portable host, comprising:
an expansion module frame and PCB;
a host-interface for coupling with the host;
a first-level I/O interface for coupling with a first external I/O device;

first-level I/O adapter circuitry for the first external I/O device;
a slot for a second-level removable expansion module; and
second-level expansion adapter circuitry for the second-level removable expansion module, the second-level expansion adapter circuitry including circuitry for coupling with at least a first type of second-level removable expansion module, the first type of second-level removable expansion module including a second-level I/O interface for coupling with a second external I/O device, and second-level I/O adapter circuitry for the second external I/O device.

40. The first-level removable expansion module of claim 39, wherein the first external I/O device is a mobile phone.

41. The first-level removable expansion module of claim 39, wherein the second-level I/O adapter circuitry includes first wireless network interface circuitry, the second-level I/O interface includes a wireless transducer, the second external I/O device includes second wireless network interface circuitry, and the coupling to the second external I/O device is wireless.

42. The first-level removable expansion module of claim 41, wherein the first wireless network interface circuitry is RF wireless network interface circuitry and the wireless transducer includes an antenna.

43. The first-level removable expansion module of claim 42, wherein the RF wireless network interface circuitry is compatible with the Bluetooth wireless network standard.

44. The first-level removable expansion module of claim 39, wherein the first external I/O device is a mobile phone, the second-level I/O adapter circuitry includes first RF network interface circuitry, the second external I/O device includes second RF network interface circuitry, and the coupling to the second external I/O device is RF.

45. The first-level removable expansion module of claim 44, wherein the portable host, the first-level removable expansion module, and the second-level removable expansion module are configured to provide a network gateway between a first network accessed via the mobile phone and a second network accessed via the first RF network interface circuitry.

46. A method of providing a gateway between a first and second network, comprising:
providing a portable host having a first-level slot;
coupling a first-level removable expansion module with the portable host via the first-level slot, the first-level removable expansion module having first-level I/O adapter circuitry and a second-level slot for a second-level removable expansion module;
coupling the first-level removable expansion module to the first network via the first-level I/O adapter circuitry;
coupling a second-level removable expansion module with the first-level removable expansion module via the second-level slot, the second-level removable expansion module having second-level I/O adapter circuitry;
coupling the second-level removable expansion module to the second network via the second-level I/O adapter circuitry; and
transferring information between the first and second networks via at least the first-level and second-level removable expansion modules.

47. The method of claim 46, wherein the coupling to the first network is via a mobile phone.

48. The method of claim 46, wherein the first network is the Internet.

49. The method of claim 46, wherein the second network is a local area network.

50. The method of claim 49, wherein the local area network is an RF based network.

51. The method of claim 50, wherein the RF based network is compatible with the Bluetooth RF network standard.

52. The method of claim 46, wherein the first network is the Internet and the second network is a local area network.

53. The method of claim 52, wherein the coupling to the Internet is via mobile phone and the local area network is compatible with the Bluetooth RF network standard.

54. A slot assembly for a removable expansion memory, the slot assembly comprising:
an expansion module kit, the kit including:
a PCB,
an I/O connector mounted on one end of the PCB,
a lower outside frame, and
an upper outside frame, the upper outside frame having an opening on the I/O connector side of the kit to both conform to the I/O connector and permit and laterally guide the insertion of the expansion memory above the I/O connector; and
a plurality of contact fingers mechanically and electrically coupled to the PCB.

55. A first-level removable expansion module for insertion into a portable host, comprising:
an expansion module frame;
a printed circuit board including circuitry;
contact fingers coupled to the circuitry of the printed circuit board;
an expansion module lid having a recessed area of size and shape for receiving a second-level removable expansion module stacked flat and partially countersunk within the recess and coupling the contacts of the second-level removable expansion module to the contact fingers; and
wherein the second-level removable expansion module is retained within the cavity and electrical coupling is maintained with the contact fingers by the proximate contact of the second-level removable expansion module with the portable host when the mated combination of the first-level and second-level removable expansion modules is inserted into the portable host.

* * * * *